United States Patent
Mohanty

(10) Patent No.: US 10,684,407 B2
(45) Date of Patent: *Jun. 16, 2020

(54) REACTIVITY ENHANCEMENT IN ION BEAM ETCHER

(71) Applicant: Facebook Technologies, LLC, Menlo Park, CA (US)

(72) Inventor: Nihar Ranjan Mohanty, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/001,694

(22) Filed: Jun. 6, 2018

(65) Prior Publication Data
US 2019/0129089 A1    May 2, 2019

Related U.S. Application Data

(60) Provisional application No. 62/579,055, filed on Oct. 30, 2017.

(51) Int. Cl.
*H01L 21/3065* (2006.01)
*G02B 27/01* (2006.01)
(Continued)

(52) U.S. Cl.
CPC ......... *G02B 6/0065* (2013.01); *G02B 5/1857* (2013.01); *G02B 6/0016* (2013.01);
(Continued)

(58) Field of Classification Search
None
See application file for complete search history.

(56) References Cited

U.S. PATENT DOCUMENTS 4,595,484 A    6/1986  Giammarco et al.
5,770,120 A *  6/1998  Kamihara ............ G02B 5/1852
                                                       216/24
(Continued)

FOREIGN PATENT DOCUMENTS

EP    1855131 A1    11/2007
EP    1183684       6/2008

OTHER PUBLICATIONS

International Application No. PCT/US2018/036515, International Search Report and Written Opinion dated Sep. 27, 2018, 15 pages.
(Continued)

*Primary Examiner* — Shamim Ahmed
(74) *Attorney, Agent, or Firm* — Kilpatrick Townsend & Stockton LLP

(57) ABSTRACT

Techniques for fabricating a slanted structure are disclosed. In one embodiment, a method of fabricating a slanted structure in a material layer includes injecting a first reactive gas into an reactive ion source generator, generating a plasma that includes reactive ions in the reactive ion source generator, extracting at least some of the reactive ions from the plasma to form a collimated reactive ion beam towards the material layer, and injecting a second reactive gas onto the material layer. The collimated reactive ion beam and the second reactive gas etch the material layer both physically and chemically to form the slanted surface-relief structure.

15 Claims, 17 Drawing Sheets

(51) Int. Cl.

| | |
|---|---|
| *G02B 6/122* | (2006.01) |
| *F21V 8/00* | (2006.01) |
| *H01J 37/32* | (2006.01) |
| *G02B 27/00* | (2006.01) |
| *G02B 5/18* | (2006.01) |
| *G02B 6/12* | (2006.01) |

(52) U.S. Cl.
CPC ....... *G02B 6/0038* (2013.01); *G02B 27/0081* (2013.01); *G02B 27/0172* (2013.01); *H01J 37/321* (2013.01); *H01J 37/32422* (2013.01); *H01J 37/32715* (2013.01); *G02B 2006/12107* (2013.01); *G02B 2006/12176* (2013.01); *G02B 2027/0174* (2013.01); *G02B 2027/0178* (2013.01); *H01J 2237/20214* (2013.01); *H01J 2237/3341* (2013.01)

(56) References Cited

U.S. PATENT DOCUMENTS

| | | | |
|---|---|---|---|
| 6,238,582 B1 | 5/2001 | Williams et al. | |
| 7,052,575 B1 * | 5/2006 | Rangarajan ....... | H01J 37/32935 156/345.13 |
| 8,087,379 B2 | 1/2012 | Chandler et al. | |
| 9,182,596 B2 | 11/2015 | Border et al. | |
| 9,341,843 B2 | 5/2016 | Border et al. | |
| 9,390,935 B2 | 7/2016 | Tomura et al. | |
| 10,004,133 B2 | 6/2018 | Liang et al. | |
| 10,073,278 B2 | 9/2018 | Vallius | |
| 2005/0211547 A1 | 9/2005 | Hanawa et al. | |
| 2006/0045987 A1 | 3/2006 | Chandler et al. | |
| 2006/0127830 A1 * | 6/2006 | Deng ................... | G02B 5/3083 431/188 |
| 2012/0177908 A1 | 7/2012 | Petorak et al. | |
| 2012/0196139 A1 | 8/2012 | Petorak et al. | |
| 2013/0192758 A1 | 8/2013 | Toth et al. | |
| 2014/0116621 A1 | 5/2014 | Mori et al. | |
| 2015/0125976 A1 | 5/2015 | Wang | |
| 2015/0279686 A1 | 10/2015 | Kuo et al. | |
| 2015/0309316 A1 | 10/2015 | Osterhout et al. | |
| 2016/0035539 A1 | 2/2016 | Sainiemi et al. | |
| 2016/0042971 A1 | 2/2016 | Mohanty | |
| 2016/0187654 A1 | 6/2016 | Border et al. | |
| 2017/0059879 A1 | 3/2017 | Vallius | |
| 2017/0301519 A1 | 10/2017 | Naim et al. | |
| 2017/0311430 A1 | 10/2017 | Liang et al. | |
| 2018/0138047 A1 * | 5/2018 | Atikian ............... | B81C 99/0095 |

OTHER PUBLICATIONS

Miller et al., "Design and Fabrication of Binary Slanted Surface-Relief Gratings for a Planar Optical Interconnection," Applied Optics, vol. 36, No. 23, Aug. 10, 1997, 12 pages.

U.S. Appl. No. 16/174,305, "Non-Final Office Action", dated Apr. 1, 2019, 14 pages.

Rowe, et al., "High-Reflectivity Surface-Relief Gratings in Single-Mode Optical Fibres", IEE Proceedings-J/Optoelectronics, vol. 134, Issue 3, Jun. 1, 1987, 6 pages.

Oxford Instruments, "Ionfab 300, Flexible Tools for Multiple Applications", 2015, retrieved from "https://plasma.oxinst.com/assets/uploads/Ionfab300_4.pdf" and printed on Mar. 19, 2019, 5 pages.

European Application No. EP18202897.7, "Extended European Search Report", dated Mar. 19, 2019, 10 pages.

Lee, et al., "Dry Etching of GaN Using Reactive Ion Beam Etching and Chemically Assisted Reactive Ion Beam Etching", MRS Proceedings, vol. 468, Jan. 1, 1997, 5 pages.

International Application No. PCT/US2018/058272, "International Search Report and Written Opinion," dated Mar. 11, 2019, 14 pages.

* cited by examiner

REACTIVITY ENHANCEMENT IN ION BEAM ETCHER

CROSS-REFERENCE TO RELATED APPLICATION

This patent application claims priority to U.S. Provisional Patent Application Ser. No. 62/579,055, filed Oct. 30, 2017, entitled "REACTIVITY ENHANCEMENT IN ION BEAM ETCHER," which is assigned to the assignee hereof and is herein incorporated by reference in its entirety for all purposes.

BACKGROUND

An artificial reality system, such as a head-mounted display (HMD) or heads-up display (HUD) system, generally includes a display configured to present artificial images that depict objects in a virtual environment. The display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. In many cases, it may be challenging to fabricate the slanted surface-relief grating with the desired profile at a desirable speed.

SUMMARY

This disclosure relates generally to techniques for fabricating slanted structures, and more specifically, to techniques for etching slant structures on various materials, such as silicon dioxide, silicon nitride, titanium dioxide, or alumina. A chemically assisted reactive ion beam etch (CARIBE) technique is used to etch the slanted structures, such as high symmetrical slanted structures or slanted structures in exotic materials (e.g., silicon nitride, organic materials, or inorganic metal oxides). The CARIBE process (e.g., the chemical compounds, the radicals, or ions) can be more precisely controlled to achieve the desired etching selectivity, etch rate, and profile of the slanted structures.

In some embodiments, a method of fabricating a slanted surface-relief structure in a material layer includes injecting a first reactive gas into an reactive ion source generator, generating a plasma including reactive ions in the reactive ion source generator, extracting at least some of the reactive ions from the plasma to form a collimated reactive ion beam towards the material layer, and injecting a second reactive gas onto the material layer. The collimated reactive ion beam and the second reactive gas etch the material layer both physically and chemically to form the slanted surface-relief structure. In some embodiments, the method also includes rotating the material layer based on a desired slant angle of the slanted surface-relief structure.

In some embodiments, a chemically assisted reactive ion beam etching (CARIBE) system for fabricating a slanted surface-relief structure in a material layer is disclosed. The CARIBE system includes an reactive ion source generator configured to generate a plasma using a first reactive gas, where the plasma includes reactive ions. The CARIBE system also includes one or more aligned collimator grids configured to extract and accelerate at least some of the reactive ions in the plasma to form a collimated reactive ion beam towards the material layer. The CARIBE system further includes a gas ring configured to inject a second reactive gas onto the material layer. The collimated reactive ion beam and the second reactive gas etch the material layer both physically and chemically to form the slanted surface-relief structure in the material layer. In some embodiments, the CARIBE system includes a rotation stage configured to hold and rotate a substrate.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

Embodiments according to the invention are in particular disclosed in the attached claims, wherein any feature mentioned in one claim category, e.g. method, can be claimed in another claim category, e.g. system as well. The dependencies or references back in the attached claims are chosen for formal reasons only. However any subject matter resulting from a deliberate reference back to any previous claims (in particular multiple dependencies) can be claimed as well, so that any combination of claims and the features thereof is disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

In an embodiment, a method of fabricating a slanted surface-relief structure in a material layer comprises: injecting a first reactive gas into an reactive ion source generator; generating a plasma in the reactive ion source generator, the plasma including reactive ions; extracting at least some of the reactive ions from the plasma to form a collimated reactive ion beam towards the material layer; and injecting a second reactive gas onto the material layer, where the collimated reactive ion beam and the second reactive gas etch the material layer both physically and chemically to form the slanted surface-relief structure.

In an embodiment, the method further comprises rotating the material layer based on a desired slant angle of the slanted surface-relief structure.

In an embodiment, the first reactive gas comprises at least one of $CF_4$, $CHF_3$, $N_2$, $O_2$, $SF_6$, $Cl_2$, $BCl_3$, HBr, $H_2$, Ar, He, or Ne.

In an embodiment, the material layer includes a semiconductor substrate, a $SiO_2$ layer, a $Si_3N_4$ material layer, a titanium oxide layer, an alumina layer, a SiC layer, a $SiO_xN_y$ layer, an amorphous silicon layer, a spin on carbon (SOC) layer, an amorphous carbon layer (ACL), a diamond like carbon (DLC) layer, a $TiO_x$ layer, an $AlO_x$ layer, a $TaO_x$ layer, or a $HFO_x$ layer.

In an embodiment generating the plasma in the reactive ion source generator comprises: applying an RF signal to an inductively coupled plasma generator of the reactive ion source generator.

In an embodiment extracting at least some of the reactive ions from the plasma to form the collimated reactive ion beam comprises: applying an extraction voltage on an extraction grid adjacent to the reactive ion source generator; and applying an acceleration voltage on an acceleration grid to extract and accelerate at least some of the reactive ions, where the extraction grid and the acceleration grid are aligned; and where the acceleration voltage is lower than the extraction voltage.

In an embodiment injecting the second reactive gas comprises injecting the second reactive gas onto the material layer using a gas ring.

In an embodiment the second reactive gas comprises at least one of $CF_4$, $CHF_3$, $N_2$, $O_2$, $SF_6$, $Cl_2$, $BCl_3$, or HBr.

In an embodiment the method further comprises neutralizing the collimated reactive ion beam before etching the material layer using the collimated reactive ion beam and the second reactive gas.

In an embodiment neutralizing the collimated reactive ion beam comprises injecting an electron beam into the collimated reactive ion beam.

In an embodiment the slanted surface-relief structure comprises a slanted surface-relief optical grating.

In an embodiment the slanted surface-relief optical grating comprises a plurality of ridges; and a leading edge of each ridge is parallel to a trailing edge of the ridge.

In an embodiment a slant angle of the leading edge and a slant angle of the trailing edge are greater than 30 degrees with respect to a surface normal of the material layer.

In an embodiment a depth of the slanted surface-relief optical grating is greater than 100 nm.

In an embodiment a duty cycle of the slanted surface-relief optical grating is greater than 60%.

In an embodiment a chemically assisted reactive ion beam etching (CARIBE) system for fabricating a slanted surface-relief structure in a material layer comprises: an reactive ion source generator configured to generate a plasma using a first reactive gas, the plasma including reactive ions; one or more aligned collimator grids configured to extract and accelerate at least some of the reactive ions in the plasma to form a collimated reactive ion beam towards the material layer; and a gas ring configured to inject a second reactive gas onto the material layer, where the collimated reactive ion beam and the second reactive gas etch the material layer both physically and chemically to form the slanted surface-relief structure in the material layer.

In an embodiment the CARIBE system further comprises a neutralizer configured to inject an electron beam into the collimated reactive ion beam to neutralize the collimated reactive ion beam.

In an embodiment the CARIBE system further comprises a rotation stage configured to hold and rotate a substrate.

In an embodiment the reactive ion source generator comprises an inductively coupled plasma generator.

In an embodiment the first reactive gas comprises at least one of $CF_4$, $CHF_3$, $N_2$, $O_2$, $SF_6$, $H_2$, $Cl_2$, $BCl_3$, HBr, Ar, He, or Ne; and the second reactive gas comprises at least one of $CF_4$, $CHF_3$, $N_2$, $O_2$, $SF_6$, $Cl_2$, $BCl_3$, or HBr.

BRIEF DESCRIPTION OF THE DRAWINGS

Illustrative embodiments are described in detail below with reference to the following figures.

Figure 1:
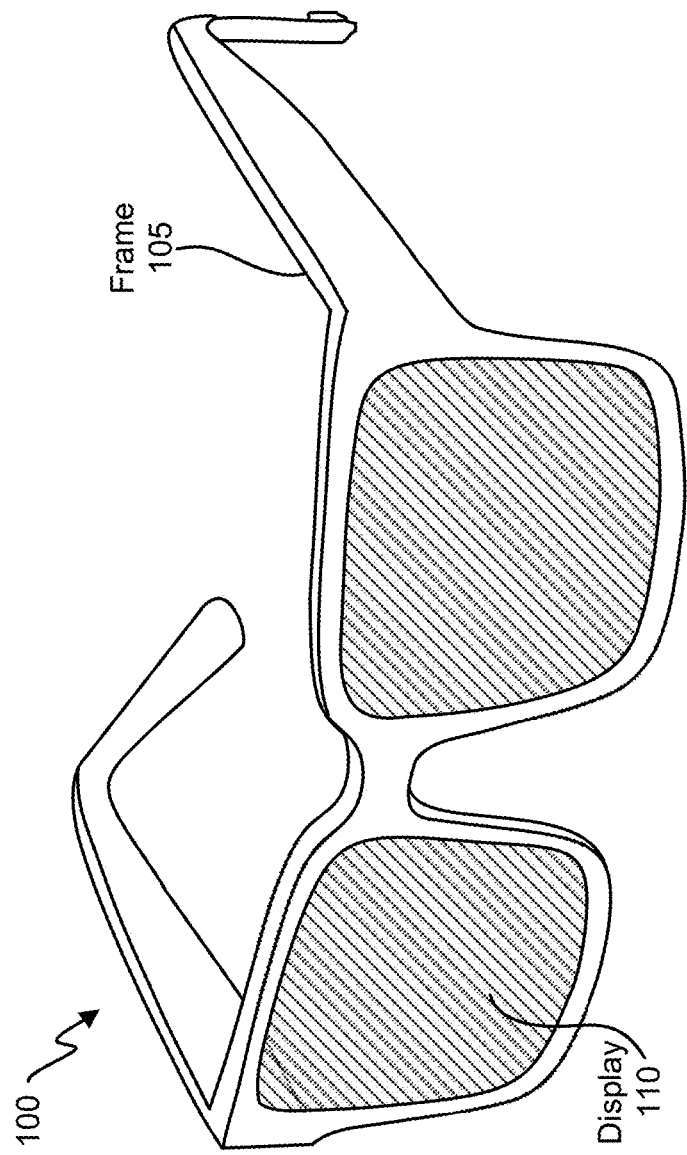
FIG. 1 is a simplified diagram of an example near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to micro- or nano-structure manufacturing. More specifically, and without limitation, this application relates to techniques for fabricating micro or nano slanted structures. Slanted structures may be used in many optical or electronic devices for manipulating behavior of light and/or electricity. However, it may often be challenging to etch high symmetrical slanted structures (e.g., a ridge with substantially equal leading edge and trailing edge) or slanted structures in exotic materials (e.g., silicon nitride, organic materials, or inorganic metal oxides). According to certain embodiments, slanted surface-relief gratings may be used in some optical devices, such as waveguide displays in artificial reality systems, to create high refractive index variations and high diffraction efficiencies. The slanted structures may not be reliably fabricated using current known etching processes, which may generally be optimized to etch features that are perpendicular to the surface being etched, such as the ion beam etching (IBE), reactive ion beam etching (RIBE), or chemically assisted ion beam etching (CAME) process. According to certain embodiments, a chemically assisted reactive ion beam etch (CARIBE) technique may be used to reliably etch the slanted structures. The CARIBE process parameters, including, for example, the chemical components, radicals, and ions used for the etching, can be more precisely controlled to achieve the desired etching selectivity, desired etch rate, and desired dimensions of the slanted structures.

In some embodiments, it is found that it is desirable to fabricate slanted structures for manipulating behaviors of light and/or electricity. Some of the benefits of the slanted structures may include a high efficiency of light transfer, a large variation in refractive indices, and/or the like. It is also found that the parallel slanted (with respect to the plane of the surface being etched) structures solve a problem unique to certain applications. Furthermore, it has been found that it may be desirable to form this type of slanted structures in different types of materials (e.g., as silicon dioxide, silicon nitride, titanium dioxide, alumina, etc.).

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

FIG. 1 is a simplified diagram of an example near-eye display 100 according to certain embodiments. Near-eye display 100 may present media to a user. Examples of media presented by near-eye display 100 may include one or more images, video, and/or audio. In some embodiments, audio may be presented via an external device (e.g., speakers and/or headphones) that receives audio information from near-eye display 100, a console, or both, and presents audio data based on the audio information. Near-eye display 100 is generally configured to operate as an artificial reality display. In some embodiments, near-eye display 100 may operate as an augmented reality (AR) display or a mixed reality (MR) display.

Near-eye display 100 may include a frame 105 and a display 110. Frame 105 may be coupled to one or more optical elements. Display 110 may be configured for the user to see content presented by near-eye display 100. In some embodiments, display 110 may include a waveguide display assembly for directing light from one or more images to an eye of the user.

Figure 2:
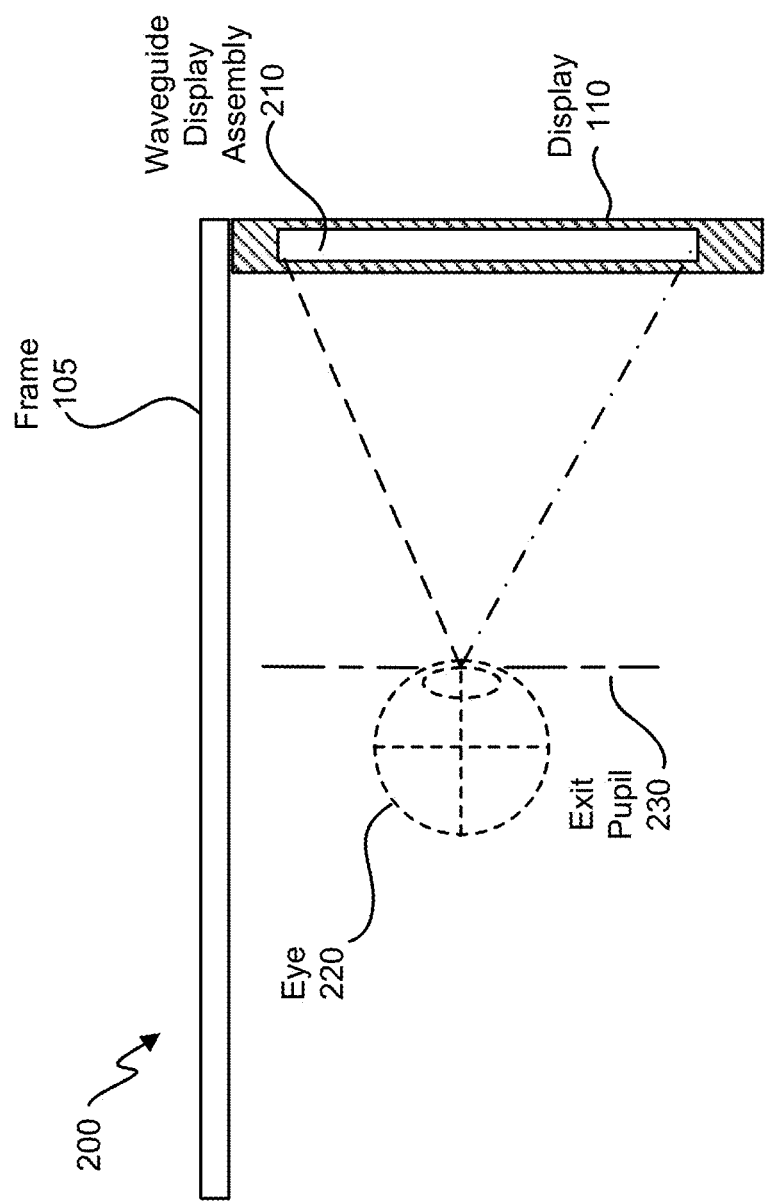
FIG. 2 is a cross-sectional view of an example near-eye display according to certain embodiments.

FIG. 2 is a cross-sectional view 200 of near-eye display 100 illustrated in FIG. 1. Display 110 may include may include at least one waveguide display assembly 210. An exit pupil 230 may be located at a location where a user's eye 220 is positioned when the user wears near-eye display 100. For purposes of illustration, FIG. 2 shows cross-section sectional view 200 associated with user's eye 220 and a single waveguide display assembly 210, but, in some embodiments, a second waveguide display may be used for the second eye of the user.

Waveguide display assembly 210 may be configured to direct image light (i.e., display light) to an eyebox located at exit pupil 230 and to user's eye 220. Waveguide display assembly 210 may include one or more materials (e.g., plastic, glass, etc.) with one or more refractive indices. In some embodiments, near-eye display 100 may include one or more optical elements between waveguide display assembly 210 and user's eye 220.

In some embodiments, waveguide display assembly 210 may include a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display may also be a polychromatic display that can be projected on multiple planes (e.g. multi-planar colored display). In some configurations, the stacked waveguide display may be a monochromatic display that can be projected on multiple planes (e.g. multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
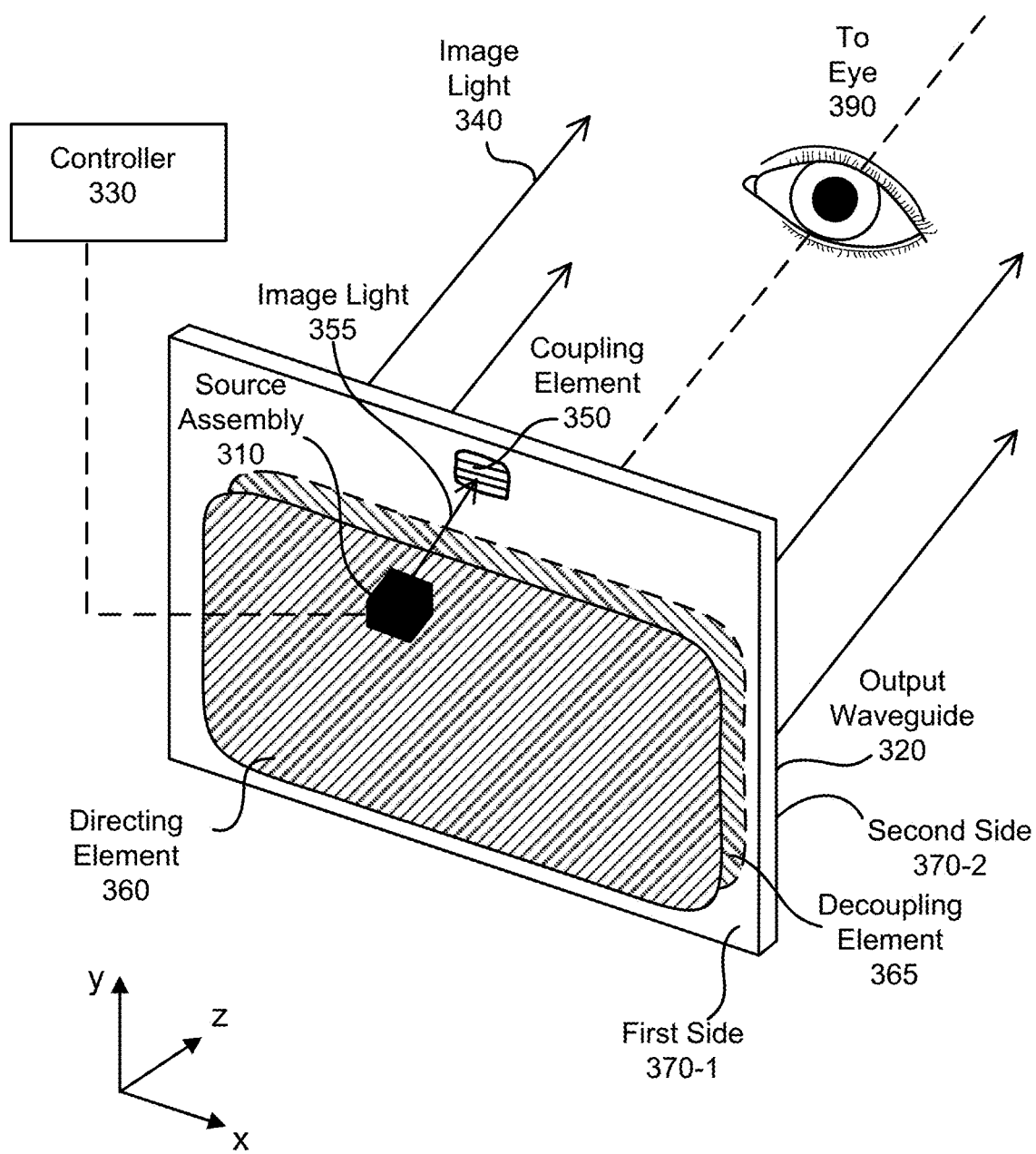
FIG. 3 is an isometric view of an example waveguide display according to certain embodiments.

FIG. 3 is an isometric view of an embodiment of a waveguide display 300. In some embodiments, waveguide display 300 may be a component (e.g., waveguide display assembly 210) of near-eye display 100. In some embodiments, waveguide display 300 may be part of some other near-eye displays or other systems that may direct image light to a particular location.

Waveguide display 300 may include a source assembly 310, an output waveguide 320, and a controller 330. For purposes of illustration, FIG. 3 shows waveguide display 300 associated with a user's eye 390, but in some embodiments, another waveguide display separate, or partially separate, from waveguide display 300 may provide image light to another eye of the user.

Source assembly 310 may generate image light 355 for display to the user. Source assembly 310 may generate and output image light 355 to a coupling element 350 located on a first side 370-1 of output waveguide 320. In some embodiments, coupling element 350 may couple image light 355 from source assembly 310 into output waveguide 320. Coupling element 350 may include, for example, a diffraction grating, a holographic grating, one or more cascaded reflectors, one or more prismatic surface elements, and/or an array of holographic reflectors. Output waveguide 320 may be an optical waveguide that can output expanded image light 340 to user's eye 390. Output waveguide 320 may receive image light 355 at one or more coupling elements 350 located on first side 370-1 and guide received image light 355 to a directing element 360.

Directing element 360 may redirect received input image light 355 to decoupling element 365 such that received input image light 355 may be coupled out of output waveguide 320 via decoupling element 365. Directing element 360 may be part of, or affixed to, first side 370-1 of output waveguide 320. Decoupling element 365 may be part of, or affixed to, a second side 370-2 of output waveguide 320, such that directing element 360 is opposed to decoupling element 365. Directing element 360 and/or decoupling element 365 may include, for example, a diffraction grating, a holographic grating, a surface-relief grating, one or more cascaded reflectors, one or more prismatic surface elements, and/or an array of holographic reflectors.

Second side 370-2 of output waveguide 320 may represent a plane along an x-dimension and a y-dimension. Output waveguide 320 may include one or more materials that can facilitate total internal reflection of image light 355. Output waveguide 320 may include, for example, silicon, plastic, glass, and/or polymers. Output waveguide 320 may have a relatively small form factor. For example, output waveguide 320 may be approximately 50 mm wide along the x-dimension, about 30 mm long along the y-dimension, and about 0.5 to 1 mm thick along a z-dimension.

Controller 330 may control scanning operations of source assembly 310. Controller 330 may determine scanning instructions for source assembly 310. In some embodiments, output waveguide 320 may output expanded image light 340 to user's eye 390 with a large field of view (FOV). For example, expanded image light 340 provided to user's eye 390 may have a diagonal FOV (in x and y) of about 60 degrees or greater and/or about 150 degrees or less. Output waveguide 320 may be configured to provide an eyebox with a length of about 20 mm or greater and/or equal to or less than about 50 mm, and/or a width of about 10 mm or greater and/or equal to or less than about 50 mm.

Figure 4:
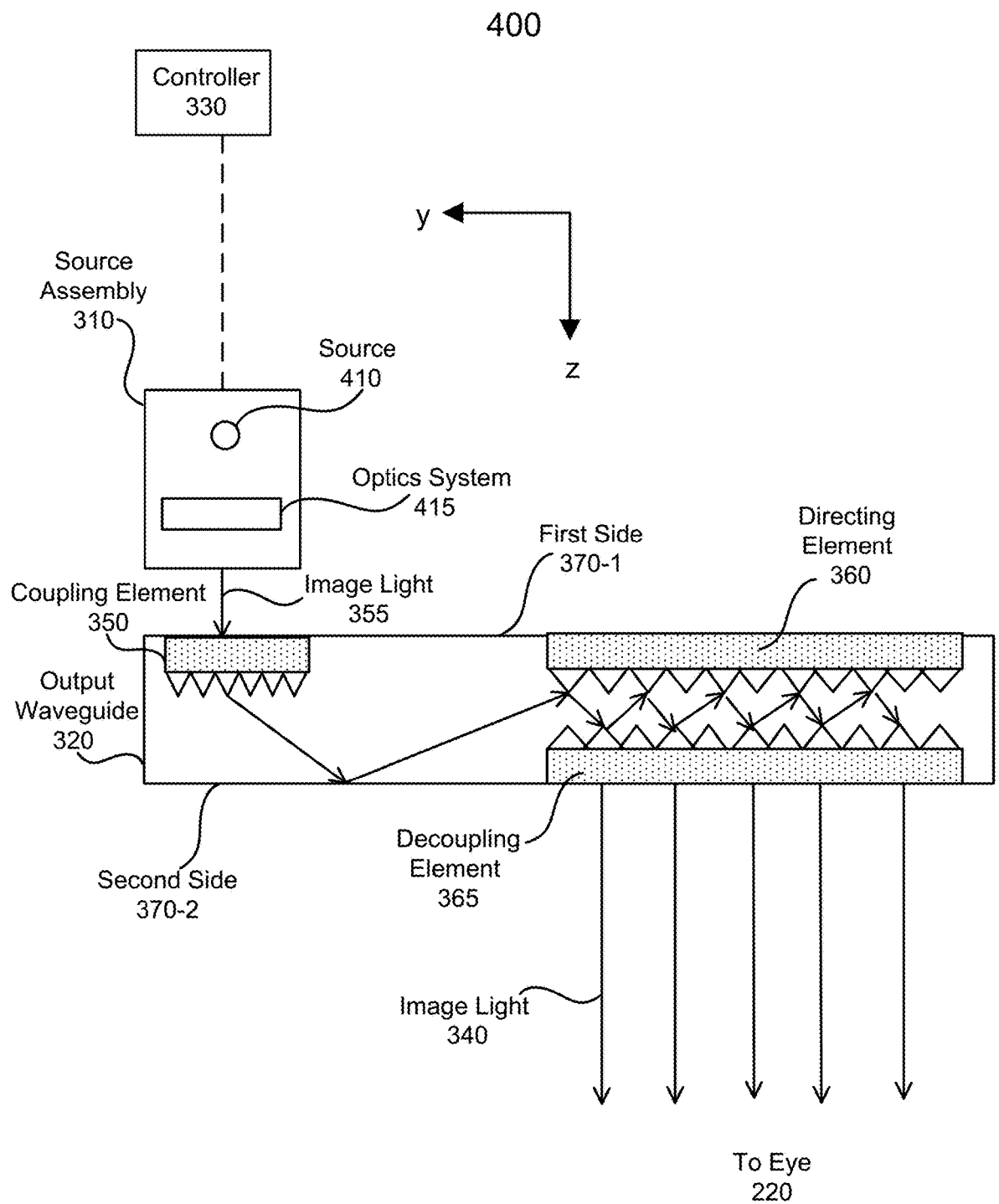
FIG. 4 is a cross-sectional view of an example waveguide display according to certain embodiments.

FIG. 4 is a cross-sectional view 400 of waveguide display 300. Waveguide display 300 may include source assembly 310 and output waveguide 320. Source assembly 310 may generate image light 355 (i.e., display light) in accordance with scanning instructions from controller 330. Source assembly 310 may include a source 410 and an optics system 415. Source 410 may include a light source that generates coherent or partially coherent light. Source 410 may include, for example, a laser diode, a vertical cavity surface emitting laser, and/or a light emitting diode.

Optics system 415 may include one or more optical components that can condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. Light emitted from optics system 415 (and also source assembly 310) may be referred to as image light 355 or display light.

Output waveguide 320 may receive image light 355 from source assembly 310. Coupling element 350 may couple image light 355 from source assembly 310 into output waveguide 320. In embodiments where coupling element 350 includes a diffraction grating, the diffraction grating may be configured such that total internal reflection may occur within output waveguide 320, and thus image light 355 coupled into output waveguide 320 may propagate internally within output waveguide 320 (e.g., by total internal reflection) toward decoupling element 365.

Directing element 360 may redirect image light 355 toward decoupling element 365 for coupling at least a portion of the image light out of output waveguide 320. In embodiments where directing element 360 is a diffraction grating, the diffraction grating may be configured to cause incident image light 355 to exit output waveguide 320 at angle(s) of inclination relative to a surface of decoupling element 365. In some embodiments, directing element 360 and/or the decoupling element 365 may be structurally similar.

Expanded image light 340 exiting output waveguide 320 may be expanded along one or more dimensions (e.g., elongated along the x-dimension). In some embodiments, waveguide display 300 may include a plurality of source assemblies 310 and a plurality of output waveguides 320. Each of source assemblies 310 may emit a monochromatic image light corresponding to a primary color (e.g., red, green, or blue). Each of output waveguides 320 may be stacked together to output an expanded image light 340 that may be multi-colored.

Figure 5:
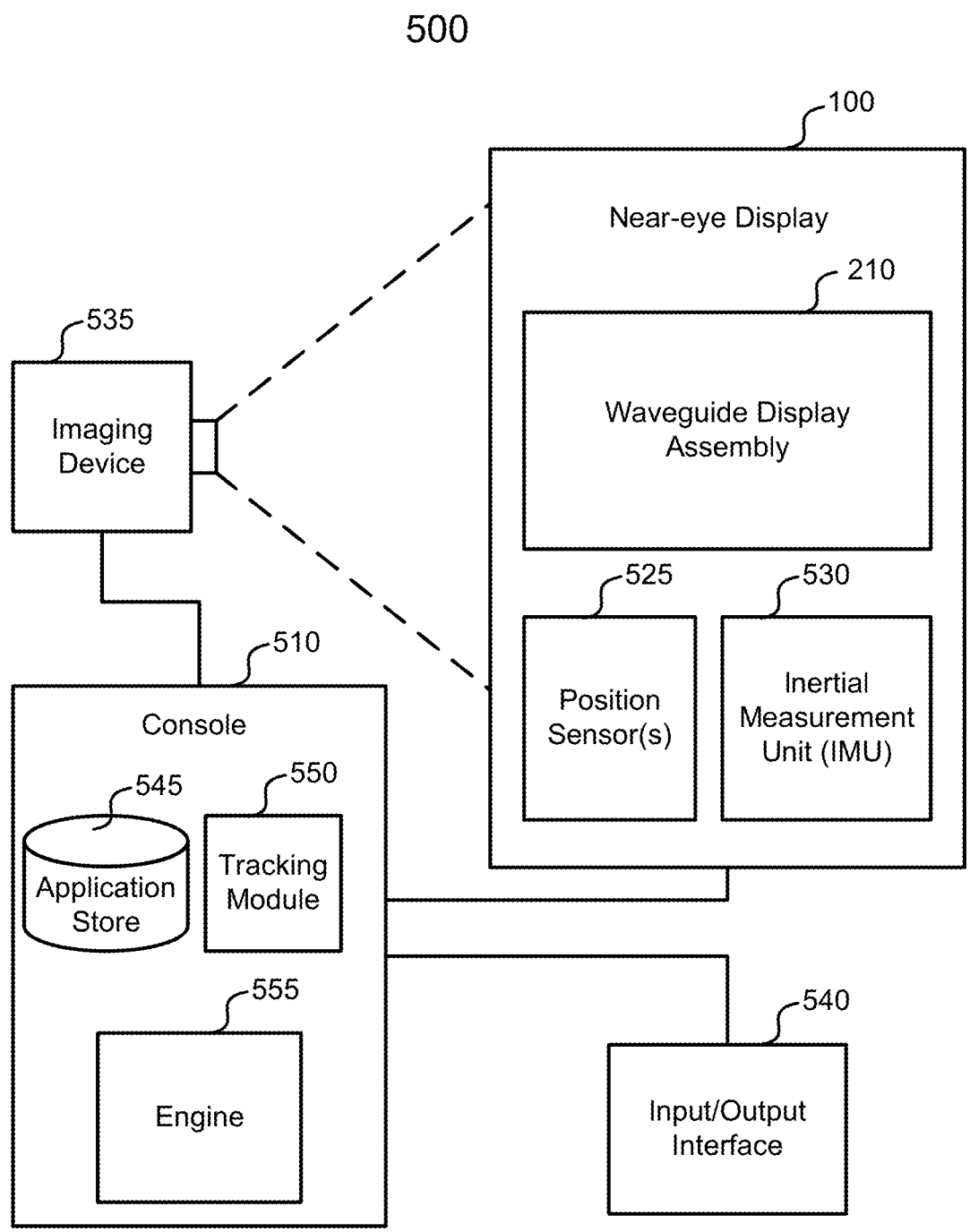
FIG. 5 is a simplified block diagram of an example artificial reality system including a waveguide display.

FIG. 5 is a simplified block diagram of an example artificial reality system 500 including waveguide display assembly 210. System 500 may include near-eye display 100, an imaging device 535, and an input/output interface 540 that are each coupled to a console 510.

As described above, near-eye display 100 may be a display that presents media to a user. Examples of media presented by near-eye display 100 may include one or more images, video, and/or audio. In some embodiments, audio may be presented via an external device (e.g., speakers and/or headphones) that may receive audio information from near-eye display 100 and/or console 510 and present audio data based on the audio information to a user. In some embodiments, near-eye display 100 may act as an artificial reality eyewear glass. For example, in some embodiments, near-eye display 100 may augment views of a physical, real-world environment, with computer-generated elements (e.g., images, video, sound, etc.).

Near-eye display 100 may include waveguide display assembly 210, one or more position sensors 525, and/or an inertial measurement unit (IMU) 530. Waveguide display assembly 210 may include a waveguide display, such as waveguide display 300 that includes source assembly 310, output waveguide 320, and controller 330 as described above.

IMU 530 may include an electronic device that can generate fast calibration data indicating an estimated position of near-eye display 100 relative to an initial position of near-eye display 100 based on measurement signals received from one or more position sensors 525.

Imaging device 535 may generate slow calibration data in accordance with calibration parameters received from console 510. Imaging device 535 may include one or more cameras and/or one or more video cameras.

Input/output interface 540 may be a device that allows a user to send action requests to console 510. An action request may be a request to perform a particular action. For example, an action request may be to start or end an application or to perform a particular action within the application.

Console 510 may provide media to near-eye display 100 for presentation to the user in accordance with information received from one or more of: imaging device 535, near-eye display 100, and input/output interface 540. In the example shown in FIG. 5, console 510 may include an application store 545, a tracking module 550, and an engine 555.

Application store 545 may store one or more applications for execution by the console 510. An application may include a group of instructions that, when executed by a processor, may generate content for presentation to the user. Examples of applications may include gaming applications, conferencing applications, video playback application, or other suitable applications.

Tracking module 550 may calibrate system 500 using one or more calibration parameters and may adjust one or more calibration parameters to reduce error in determination of the position of near-eye display 100. Tracking module 550 may track movements of near-eye display 100 using slow calibration information from imaging device 535. Tracking module 550 may also determine positions of a reference point of near-eye display 100 using position information from the fast calibration information.

Engine 555 may execute applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210. The signal may determine a type of content to present to the user.

There may be many different ways to implement the waveguide display. For example, in some implementations, output waveguide 320 may include a slanted surface between first side 370-1 and second side 370-2 for coupling image light 355 into output waveguide 320. In some implementations, the slanted surface may be coated with a reflective coating to reflect light towards directing element 360. In some implementations, the angle of the slanted surface may be configured such that image light 355 may be reflected by the slanted surface due to total internal reflection. In some implementations, directing element 360 may not be used, and light may be guided within output waveguide 320 by total internal reflection. In some implementations, decoupling elements 365 may be located near first side 370-1.

In some implementations, output waveguide 320 and decoupling element 365 (and directing element 360 if used) may be transparent to light from the environment, and may act as an optical combiner for combining image light 355 and light from the physical, real-world environment in front of near-eye display 100. As such, the user can view both artificial images of artificial objects from source assembly 310 and real images of real objects in the physical, real-world environment, which may be referred to as optical see-through.

Figure 6:
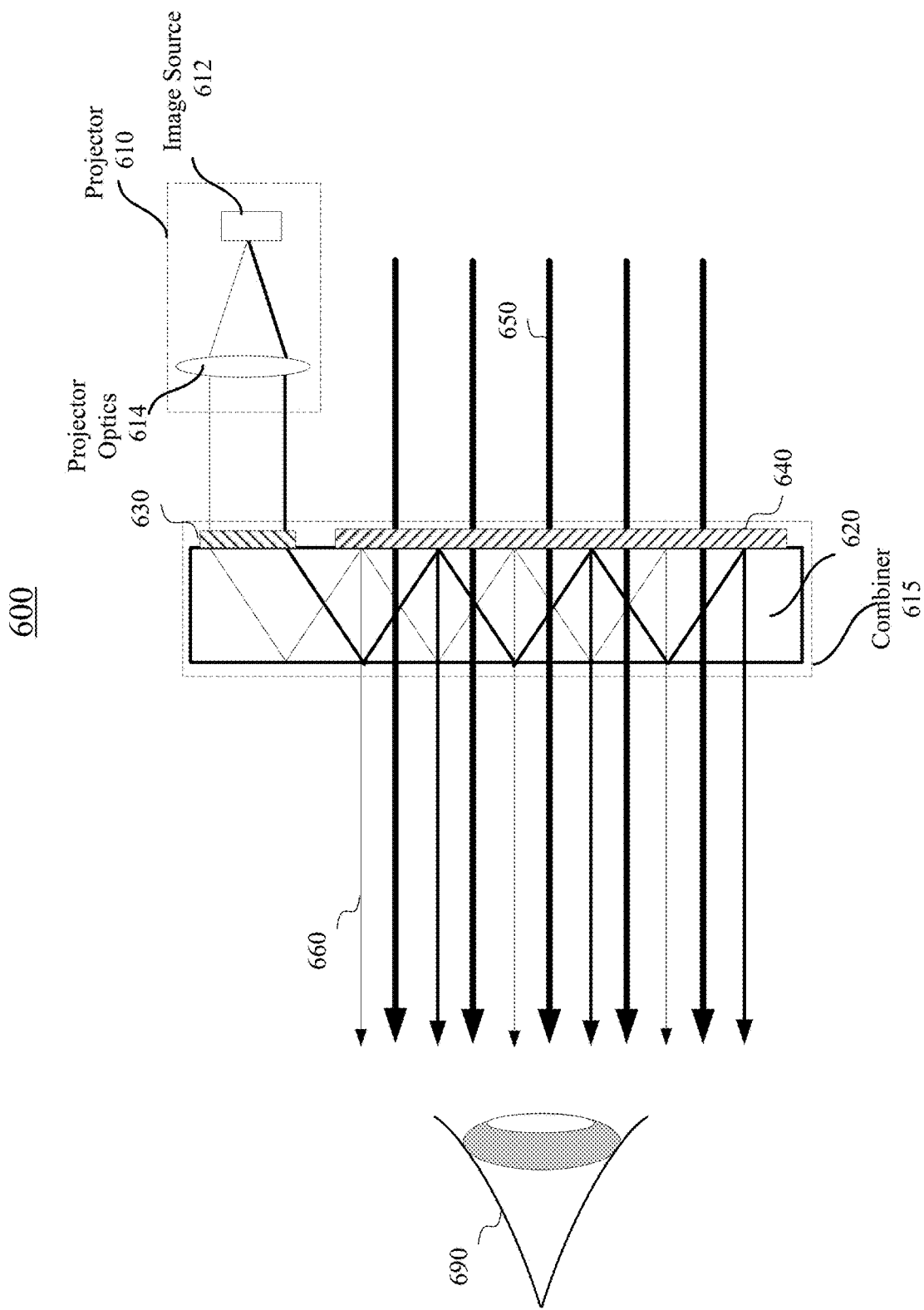
FIG. 6 illustrates an example optical see-through augmented reality system using a waveguide display according to certain embodiments.

FIG. 6 illustrates an example optical see-through augmented reality system 600 using a waveguide display according to certain embodiments. Augmented reality system 600 may include a projector 610 and a combiner 615. Projector 610 may include a light source or image source 612 and projector optics 614. In some embodiments, image source 612 may include a plurality of pixels that displays virtual objects, such as an LCD display panel or an LED display panel. In some embodiments, image source 612 may include a light source that generates coherent or partially coherent light. For example, image source 612 may include a laser diode, a vertical cavity surface emitting laser, and/or a light emitting diode. In some embodiments, image source 612 may include a plurality of light sources each emitting a monochromatic image light corresponding to a primary color (e.g., red, green, or blue). In some embodiments, image source 612 may include an optical pattern generator, such as a spatial light modulator. Projector optics 614 may include one or more optical components that can condition the light from image source 612, such as expanding, collimating, scanning, or projecting light from image source 612 to combiner 615. The one or more optical components may include, for example, one or more lenses, liquid lenses, mirrors, apertures, and/or gratings. In some embodiments, projector optics 614 may include a liquid lens (e.g., a liquid crystal lens) with a plurality of electrodes that allows scanning of the light from image source 612.

Combiner 615 may include an input coupler 630 for coupling light from projector 610 into a substrate 620 of combiner 615. Input coupler 630 may include a volume holographic grating, a diffractive optical elements (DOE) (e.g., a surface-relief grating), or a refractive coupler (e.g., a wedge or a prism). Input coupler 630 may have a coupling efficiency of greater than 30%, 50%, 75%, 90%, or higher for visible light. As used herein, visible light may refer to light with a wavelength between about 380 nm to about 750 nm. Light coupled into substrate 620 may propagate within substrate 620 through, for example, total internal reflection (TIR). Substrate 620 may be in the form of a lens of a pair of eyeglasses. Substrate 620 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 620 may be transparent to visible light. A material may be "transparent" to a light beam if the light beam can pass through the material with a high transmission rate, such as larger than 50%, 60%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 620 may include or may be coupled to a plurality of output couplers 640 configured to extract at least a portion of the light guided by and propagating within substrate 620 from substrate 620, and direct extracted light 660 to an eye 690 of the user of augmented reality system 600. As input coupler 630, output couplers 640 may include grating couplers (e.g., volume holographic gratings or surface-relief gratings), other DOEs, prisms, etc. Output couplers 640 may have different coupling (e.g., diffraction) efficiencies at different locations. Substrate 620 may also allow light 650 from environment in front of combiner 615 to pass through with little or no loss. Output couplers 640 may also allow light 650 to pass through with little loss. For example, in some implementations, output couplers 640 may have a low diffraction efficiency for light 650 such that light 650 may be refracted or otherwise pass through output couplers 640 with little loss. In some implementations, output couplers 640 may have a high diffraction efficiency for light 650 and may diffract light 650 to certain desired directions (i.e., diffraction angles) with little loss. As a result, the user may be able to view combined images of the environment in front of combiner 615 and virtual objects projected by projector 610.

Figure 7:
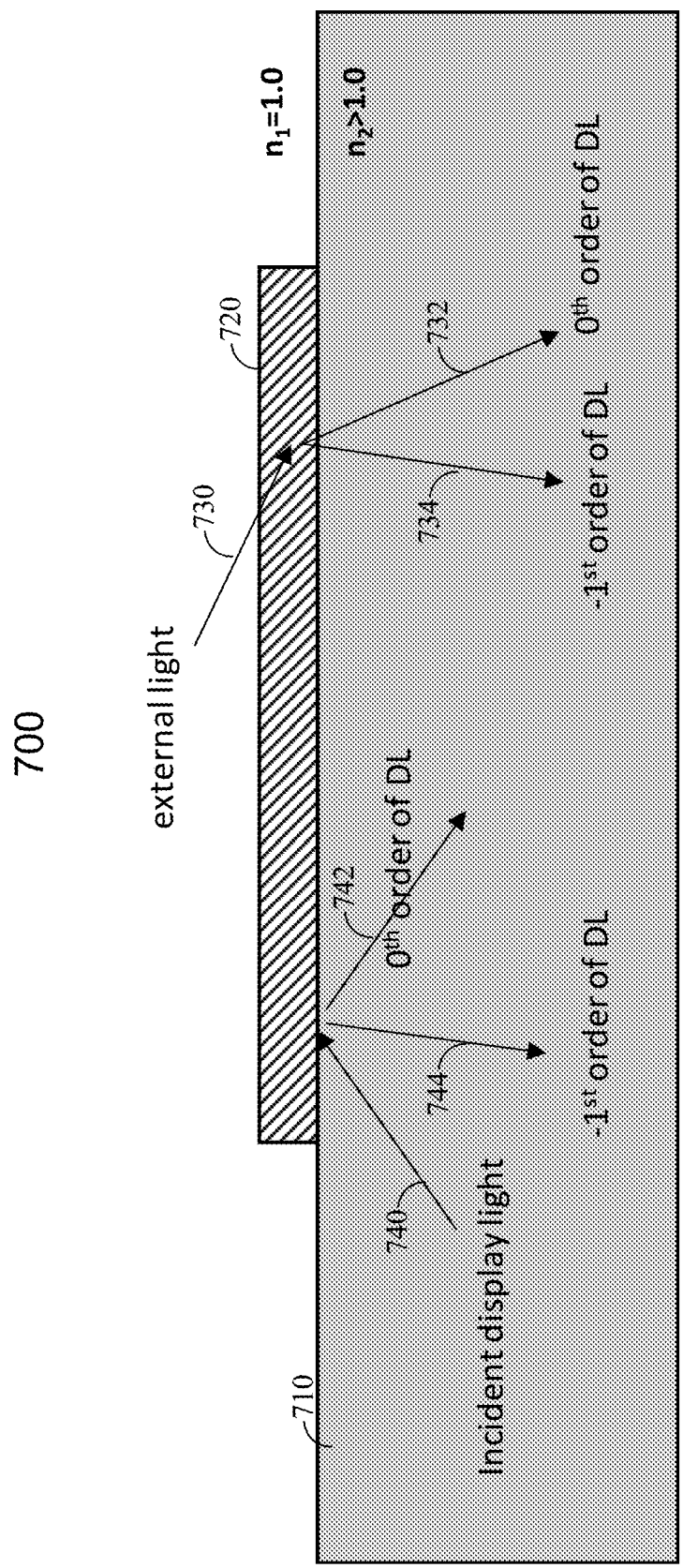
FIG. 7 illustrates propagations of display light and external light in an example waveguide display.

FIG. 7 illustrates propagations of incident display light 740 and external light 730 in an example waveguide display 700 including a waveguide 710 and a grating coupler 720. Waveguide 710 may be a flat or curved transparent substrate with a refractive index $n_2$ greater than the free space refractive index $n_1$ (i.e., 1.0). Grating coupler 720 may include, for example, a Bragg grating or a surface-relief grating.

Incident display light 740 may be coupled into waveguide 710 by, for example, input coupler 630 of FIG. 6 or other couplers (e.g., a prism or slanted surface) described above. Incident display light 740 may propagate within waveguide 710 through, for example, total internal reflection. When incident display light 740 reaches grating coupler 720, incident display light 740 may be diffracted by grating coupler 720 into, for example, a $0^{th}$ order diffraction (i.e., reflection) light 742 and a −1st order diffraction light 744. The $0^{th}$ order diffraction may continue to propagate within waveguide 710, and may be reflected by the bottom surface of waveguide 710 towards grating coupler 720 at a different location. The −1st order diffraction light 744 may be coupled (e.g., refracted) out of waveguide 710 towards the user's eye, because a total internal reflection condition may not be met at the bottom surface of waveguide 710 due to the diffraction angle of the $-1^{st}$ order diffraction light 744.

External light 730 may also be diffracted by grating coupler 720 into, for example, a $0^{th}$ order diffraction light 732 or a −1st order diffraction light 734. The $0^{th}$ order diffraction light 732 or the −1st order diffraction light 734 may be refracted out of waveguide 710 towards the user's eye. Thus, grating coupler 720 may act as an input coupler for coupling external light 730 into waveguide 710, and may also act as an output coupler for coupling incident display light 740 out of waveguide 710. As such, grating coupler 720 may act as a combiner for combining external light 730 and incident display light 740 and send the combined light to the user's eye.

In order to diffract light at a desired direction towards the user's eye and to achieve a desired diffraction efficiency for certain diffraction orders, grating coupler 720 may include a blazed or slanted grating, such as a slanted Bragg grating or surface-relief grating, where the grating ridges and grooves may be tilted relative to the surface normal of grating coupler 720 or waveguide 710.

Figure 8:
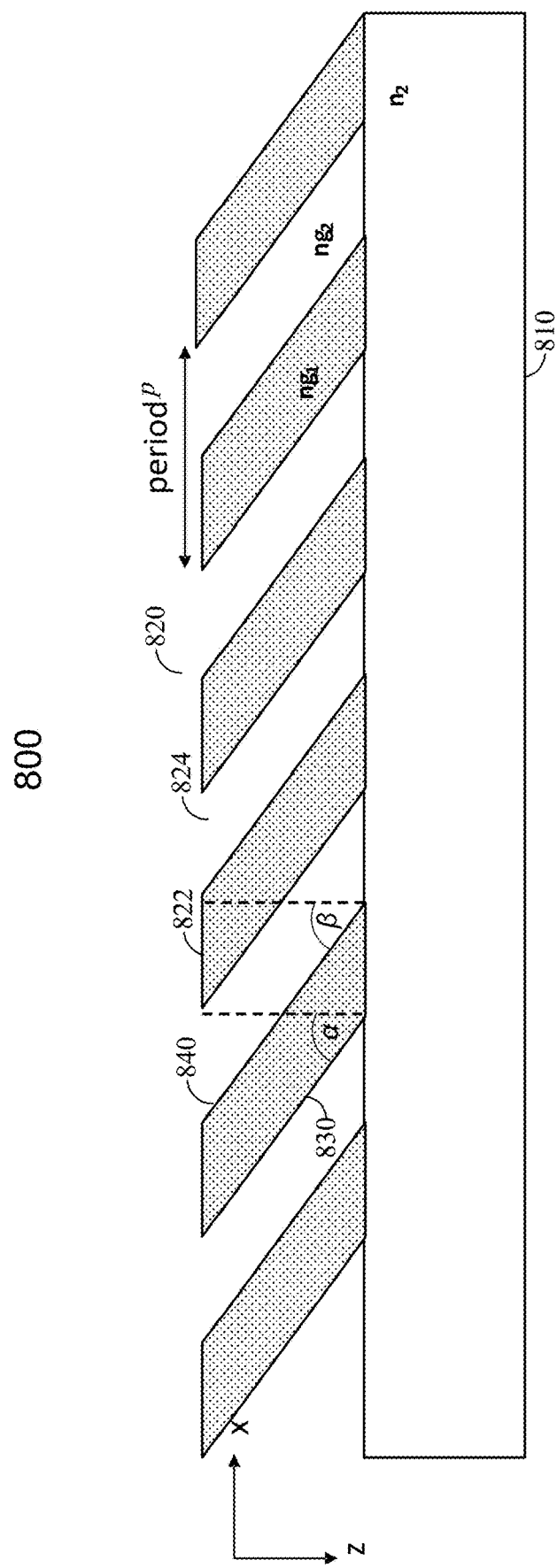
FIG. 8 illustrates an example slanted grating coupler in an example waveguide display according to certain embodiments.

FIG. 8 illustrates an example slanted grating 820 in an example waveguide display 800 according to certain embodiments. Waveguide display 800 may include slanted grating 820 on a waveguide 810, such as substrate 620. Slanted grating 820 may act as a grating coupler for couple light into or out of waveguide 810. In some embodiments, slanted grating 820 may include a periodic structure with a period p. For example, slanted grating 820 may include a plurality of ridges 822 and grooves 824 between ridges 822. Each period of slanted grating 820 may include a ridge 822 and a groove 824, which may be an air gap or a region filled with a material with a refractive index $n_{g2}$. The ratio between the width of a ridge 822 and the grating period p may be referred to as duty cycle. Slanted grating 820 may have a duty cycle ranging, for example, from about 10% to about 90% or greater. In some embodiments, the duty cycle may vary from period to period. In some embodiments, the period p of the slanted grating may vary from one area to another on slanted grating 820, or may vary from one period to another (i.e., chirped) on slanted grating 820.

Ridges 822 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 822 may include a leading edge 830 with a slant angel α and a trailing edge 840 with a slant angle β. In some embodiments, leading edge 830 and training edge 840 of each ridge 822 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70% or larger.

In some implementations, grooves 824 between the ridges 822 may be over-coated or filled with a material having a refractive index $n_{g2}$ higher or lower than the refractive index of the material of ridges 822. For example, in some embodiments, a high refractive index material, such as Hafnia, Titania, Tantalum oxide, Tungsten oxide, Zirconium oxide, Gallium sulfide, Gallium nitride, Gallium phosphide, silicon, and a high refractive index polymer, may be used to fill grooves 824. In some embodiments, a low refractive index material, such as silicon oxide, alumina, porous silica, or fluorinated low index monomer (or polymer), may be used to fill grooves 824. As a result, the difference between the refractive index of the ridges and the refractive index of the grooves may be greater than 0.1, 0.2, 0.3, 0.5, 1.0, or higher.

The slanted grating may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithography techniques including slanted etching. In some implementations, the slanted grating may be fabricated using nanoimprint lithography (NIL) molding techniques. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Techniques and processes for fabricating the slanted grating described below are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted grating. Techniques disclosed herein may also be used to fabricate other slanted structures on various materials.

Figure 9A:
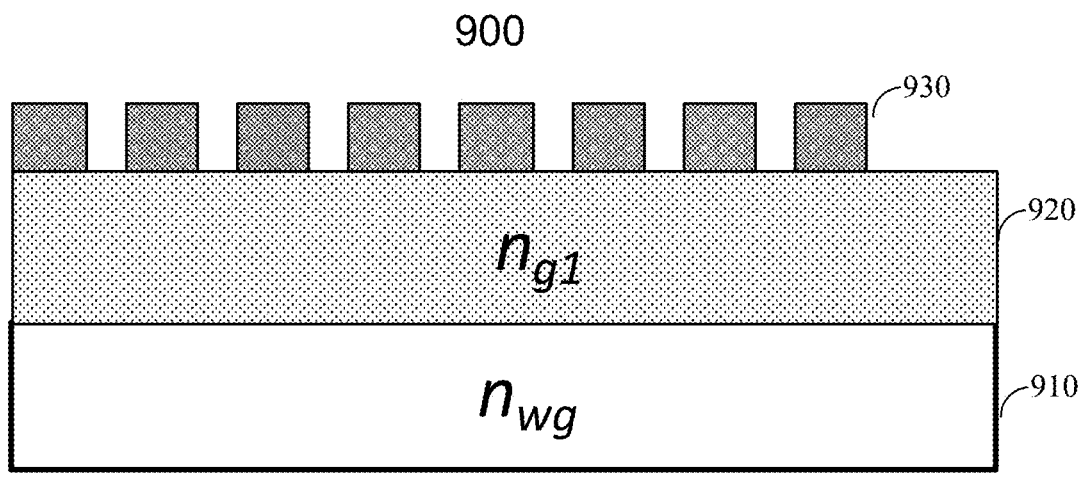
FIGS. 9A-9C illustrate an example process for fabricating a slanted surface-relief structure according to certain embodiments.
Figure 9B:
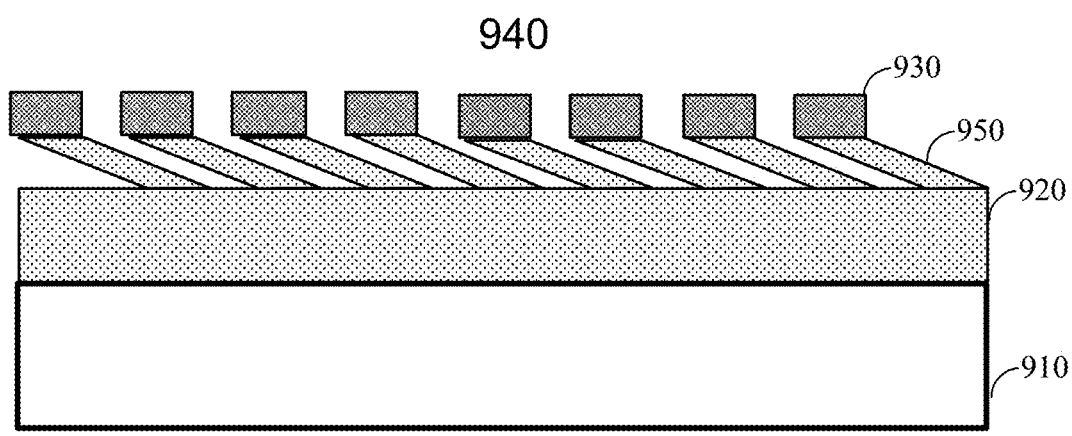
Figure 9C:
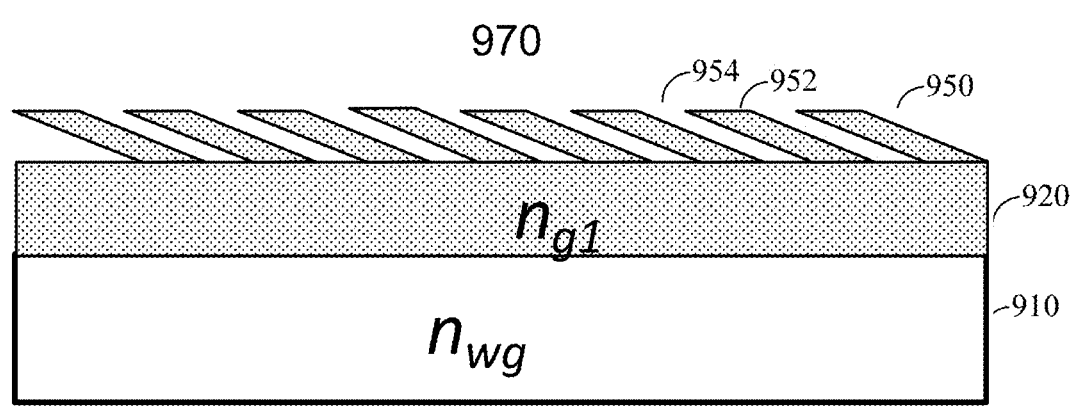

FIGS. 9A-9C illustrate an example simplified process for fabricating a slanted surface-relief grating by slanted etching according to certain embodiments. FIG. 9A shows a structure 900 after a lithography process, such as a photolithography process. Structure 900 may include a substrate 910 that may be used as the waveguide of a waveguide display described above, such as a glass or quartz substrate. Structure 900 may also include a layer of grating material 920, such as $Si_3N_4$ or $SiO_2$. Substrate 910 may have a refractive index $n_{wg}$, and the layer of grating material 920 may have a refractive index $n_{g1}$. In some embodiments, the layer of grating material 920 may be a part of substrate 910. A mask layer 930 with a desired pattern may be formed on the layer of grating material 920. Mask layer 930 may include, for example, a photoresist material, a metal (e.g., copper, chrome, titanium, aluminum, or molybdenum), an intermetallic compound (e.g., MoSiON), or a polymer. Mask layer 930 may be formed by, for example, the optical projection or electron beam lithography process, NIL process, or multi-beam interference process.

FIG. 9B shows a structure 940 after a slanted etching process, such as a dry etching process (e.g., reactive ion etching (RIE), inductively coupled plasma (ICP), deep silicon etching (DSE), ion beam etching (IBE), or variations of IBE). The slanted etching process may include one or more sub-steps. The slanted etching may be performed by, for example, rotating structure 900 and etching the layer of grating material 920 by the etching beam based on the desired slant angle. After the etching, a slanted grating 950 may be formed in the layer of grating material 920.

FIG. 9C shows a structure 970 after mask layer 930 is removed. Structure 970 may include substrate 910, the layer of grating material 920, and slanted grating 950. Slanted grating 950 may include a plurality of ridges 952 and grooves 954. Techniques such as plasma or wet etching may be used to strip mask layer 930 with appropriate chemistry. In some implementations, mask layer 930 may not be removed and may be used as part of the slanted grating.

Subsequently, in some implementations, the post-patterning (e.g., over-coating) process may be performed to over-coat slanted grating 950 with a material having a refractive index higher or lower than the material of ridges 952. For example, as described above, in some embodiments, a high refractive index material, such as Hafnia, Titania, Tungsten oxide, Zirconium oxide, Gallium sulfide, Gallium nitride, Gallium phosphide, silicon, and a high refractive index polymer, may be used for the over-coating. In some embodiments, a low refractive index material, such as silicon oxide, alumina, porous silica, or fluorinated low index monomer (or polymer), may be used for the over-coating. As a result, the difference between the refractive index of the ridges and the refractive index of the grooves may be greater than 0.1, 0.2, 0.3, 0.5, 1.0, or higher.

Figure 10:
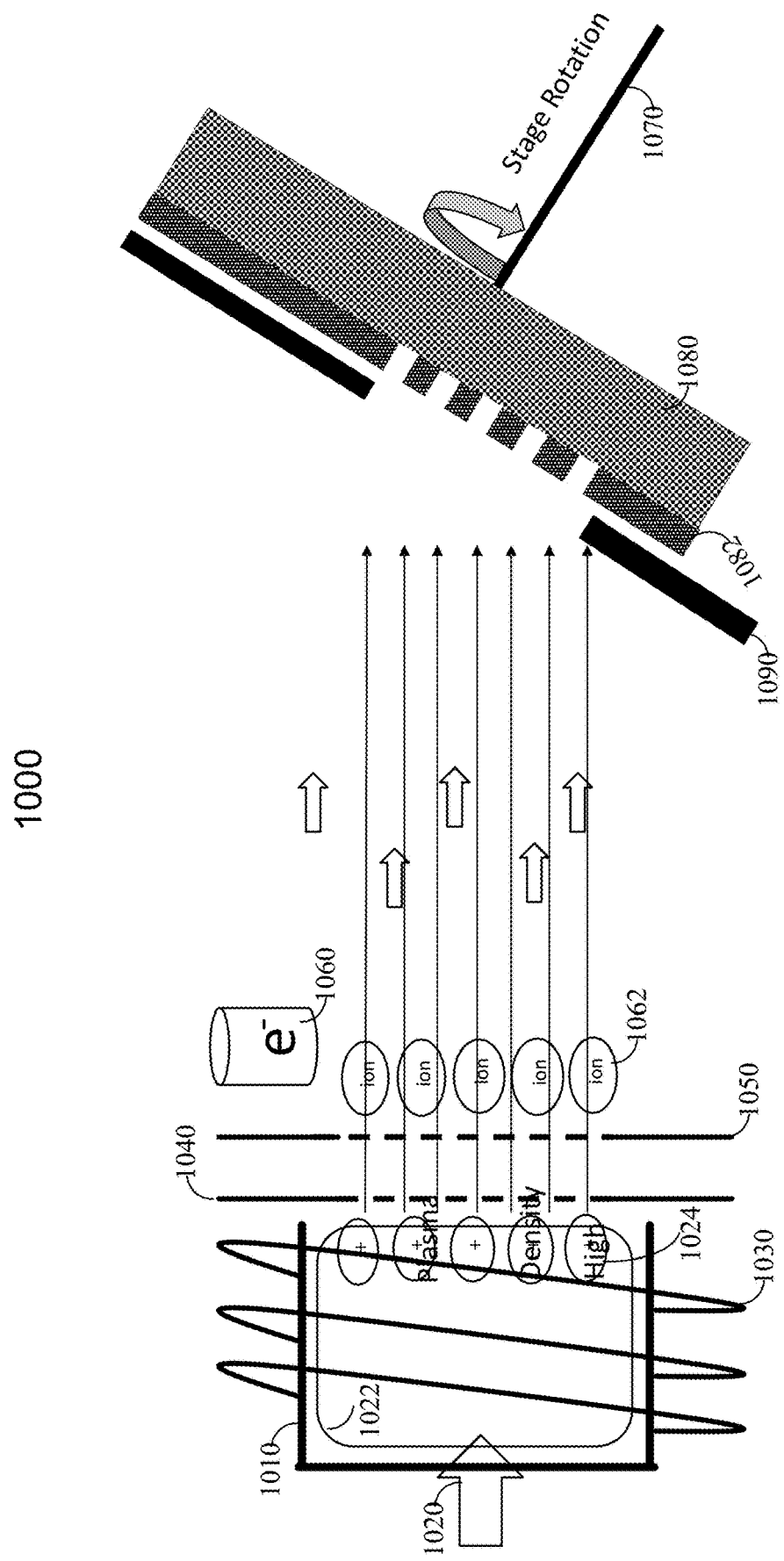
FIG. 10 illustrates an example ion beam etching system for fabricating a slanted surface-relief structure.

FIG. 10 illustrates an example ion beam etching (IBE) system 1000 for fabricating a slanted surface-relief structure. Ion beam etching is one process enabler in surface relief grating fabrication. Ion beam etching generally uses a highly collimated and highly directional ion beam to physically mill materials from a substrate mounted on a rotation stage with an adjustable rotation angle.

IBE system 1000 may include an ion source generator 1010. Ion source generator 1010 may include an inert gas inlet 1020 for receiving an inert gas, such as an Argon gas, into a chamber of ion source generator 1010. A plasma may be generated in ion source generator 1010 via an RF inductively coupled plasma (ICP) generator 1030, where highly energetic electrons may ionize neutrals of the injected inert gas (e.g., Ar) through collisions with the neutrals. A high density plasma 1022 may be generated within ion source generator 1010 by the impact ionization. High density plasma 1022 may be considered as a sea of neutrals with positive ions 1024 and negative electrons in charge equilibrium.

IBE system 1000 may also include one or more aligned collimator grids for extracting a collimated ion beam 1062 from high density plasma 1022 formed within ion source generator 1010. The aligned collimator grids may be implemented in various ways. For example, as shown in FIG. 10, the aligned collimator grids may include an extraction grid 1040 that may contact high density plasma 1022 and control its potential, and an acceleration grid 1050 that may be driven by an adjustable negative high voltage supply for accelerating the extracted ions. A beam neutralizer 1060 may be disposed near the aligned collimator grids and may emit an electron beam into collimated ion beam 1062 to achieve a net neutral charge flux associated with collimated ion beam 1062 in order to prevent the buildup of positive charges on the structure to be etched.

The highly directional collimated ion beam 1062 may physically mill materials from a material layer 1080 to be etched, such as, for example, a semiconductor wafer, a glass substrate, a $Si_3N_4$ material layer, a titanium oxide layer, an alumina layer, etc. Material layer 1080 may be partially covered by a mask 1082, which may be formed on material layer 1080 by, for example, a photolithography process. Mask 1082 may include, for example, a photoresist material, a metal (e.g., copper, chrome, aluminum, or molybdenum), an intermetallic compound (e.g., $MoSi_2$), or a polymer. In some embodiments, a shutter 1090 (or blade) may be used to control the etch time and/or the etch region. Material layer 1080 may be mounted on a rotation stage 1070 that can be rotated to modify the angle of material layer 1080 with respect to the highly directional collimated ion beam 1062. The ability to modify the angle of material layer 1080 may allow for the creation of tailored sidewall profiles with minimal sputtered redeposition on mask 1082. Since the IBE mechanism is purely physical, the etch rate may not be as fast as desired. In addition, the energetic ions may cause stoichiometric damage to the material layer and introduce defects, and thus may lead to degraded performance of the etched slanted structure.

Figure 11:
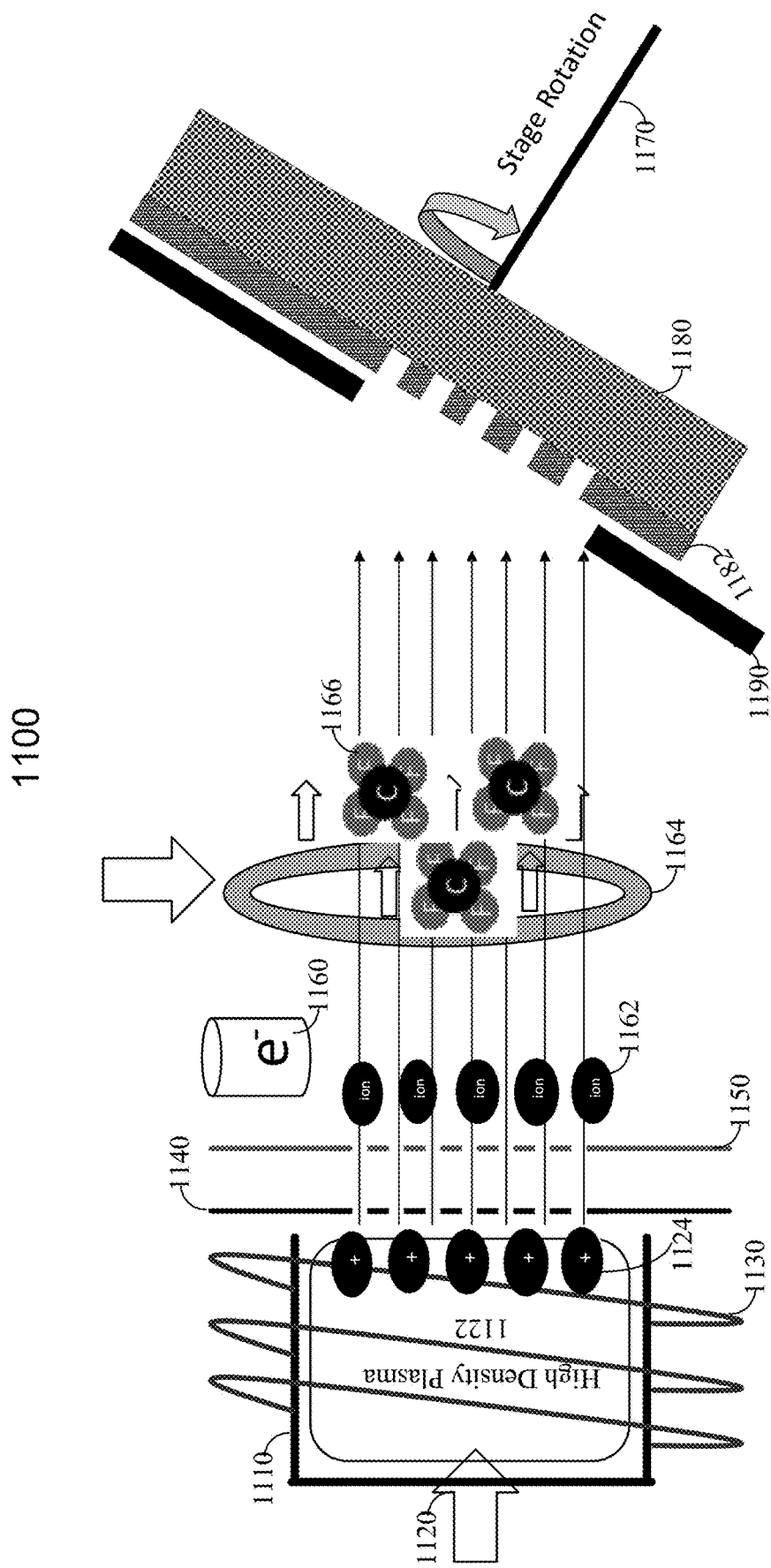
FIG. 11 illustrates an example chemically assisted ion beam etching (CAIBE) system for fabricating a slanted surface-relief structure.

FIG. 11 illustrates an example chemically assisted ion beam etching (CAIBE) system 1100 for fabricating a slanted surface-relief structure. In the chemically assisted ion beam etching, reactive species, such as a reactive gas (e.g., $CF_4$, $CHF_3$, $N_2$, $O_2$, $SF_6$, $Cl_2$, $BCl_3$, HBr, etc.) may be introduced into the process independent of the ion beam. Thus, the material layer to be etched may be etched both physically and chemically.

As IBE system 1000, CAIBE system 1100 may include an ion source generator 1110. Ion source generator 1110 may be similar to ion source generator 1010 described above with respect to FIG. 10. Ion source generator 1110 may include an inert gas inlet 1120 for receiving an inert gas, such as an Argon gas, into a chamber of ion source generator 1110. A plasma may be generated in ion source generator 1110 via an RF inductively coupled plasma (ICP) generator 1130. A high density plasma 1122 may be generated within ion source generator 1110 by impact ionization. One or more aligned collimator grids may be used to extract a collimated ion beam 1162 from high density plasma 1122. For example, as shown in FIG. 11, the aligned collimator grids may include an extraction grid 1140 that may contact high density plasma 1122 and control its potential, and an acceleration grid 1150 that may be driven by an adjustable negative high voltage supply for accelerating the extracted ions. A beam neutralizer 1160 may be disposed near the aligned collimator grids and may emit an electron beam into collimated ion beam 1162 to achieve a net neutral charge flux associated with collimated ion beam 1162 in order to prevent the buildup of positive charges on the structure to be etched.

In addition, an reactive gas 1166 (e.g., $CF_4$, $CHF_3$, $N_2$, $O_2$, $SF_6$, $Cl_2$ or $BCl_3$ or HBr etc.) may be injected onto a material layer 1180 to be etched using a gas ring 1164. In general, reactive gas 1166 may be injected at a location close to material layer 1180. Reactive gas and collimated ion beam 1162 may reach areas of material layer 1180 uncovered by a mask 1182, and both physically (as in IBE) and chemically etch the uncovered area. For example, a glass substrate may be chemically etched by a reactive gas $CF_4$ according to:

$$SiO_2 + CF_4 \rightarrow SiF_4 + CO_2.$$

$SiF_4$ and $CO_2$ are volatile materials that may be easily removed. As IBE system 1000, CAIBE system 1100 may include a shutter 1190 (or blade) for controlling the etch time and/or the etch region. Material layer 1180 may be mounted on a rotation stage 1170 that can be rotated to modify the angle of material layer 1180 with respect to the highly directional collimated ion beam 1162. For certain materials, an CAIBE system may offer additional control of etch anisotropy, sputter redeposition, and etch rate over an IBE system.

Figure 12:
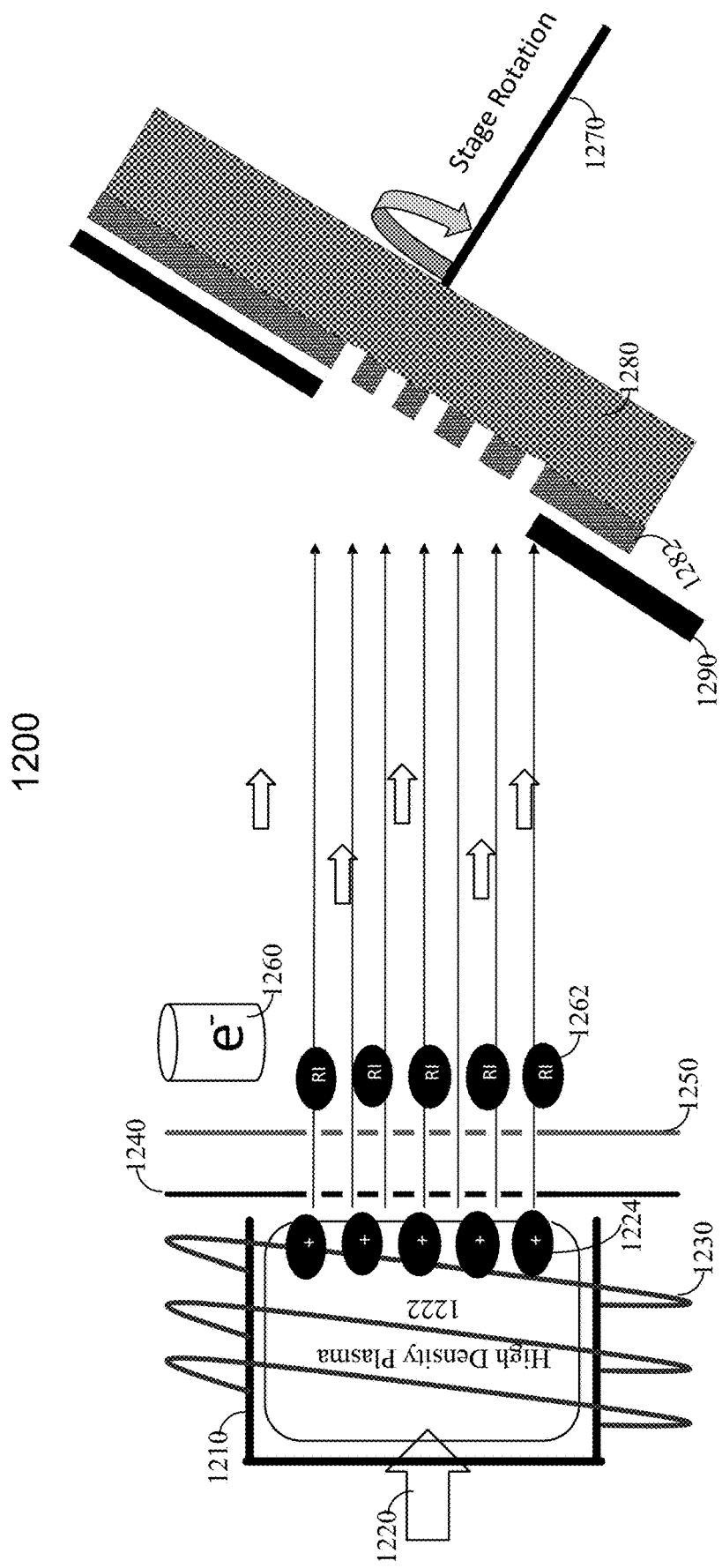
FIG. 12 illustrates an example reactive ion beam etching (RIBE) system for fabricating a slanted surface-relief structure.

FIG. 12 illustrates an example reactive ion beam etching (RIBE) system 1200 for fabricating a slanted surface-relief structure. Reactive ion beam etching system 1200 may be similar to IBE system 1000, except that a reactive gas (e.g., $CF_4$, $CHF_3$, $N_2$, $O_2$, $SF_6$, etc.) may also be injected into the ion source generator to form a reactive ion beam that can both physically and chemically etch the material layer to be etched.

RIBE system 1200 may be similar to IBE system 1000, and may include an ion source generator 1210 for generating a high density plasma 1222. Ion source generator 1210 may include an gas inlet 1220 for receiving a reactive gas (e.g., $CF_4$, $CHF_3$, $N_2$, $O_2$, $SF_6$, $Cl_2$, $BCl_3$, or HBr, etc.) and, in some cases, an inert gas (e.g., Argon gas, Helium gas, or Neon gas) into a chamber of ion source generator 1210. High density plasma 1222 may be generated by impact ionization in ion source generator 1210 via an RF inductively coupled plasma (ICP) generator 1230. One or more aligned collimator grids may be used to extract a collimated reactive ion beam 1262 from high density plasma 1222. For example, as shown in FIG. 12, the aligned collimator grids may include an extraction grid 1240 that may contact high density plasma 1222 and control its potential, and an acceleration grid 1250 that may be driven by an adjustable negative high voltage supply for accelerating the extracted reactive ions. A beam neutralizer 1260 may be disposed near the aligned collimator grids and may emit an electron beam into collimated reactive ion beam 1262 to achieve a net neutral charge flux associated with collimated reactive ion beam 1262 in order to prevent the buildup of positive charges on the structure to be etched.

Collimated reactive ion beam 1262 may reach areas of a material layer 1280 uncovered by a mask 1282, and physically and chemically etched the uncovered area. As IBE system 1000 and CAIBE system 1100, RIBE system 1200 may also include a shutter 1290 (or blade) for controlling the etch time and/or the etch region. Material layer 1280 may be mounted on a rotation stage 1270 that can be rotated to modify the angle of material layer 1280 with respect to the highly directional collimated reactive ion beam 1262. For certain materials, an RIBE system may offer additional control of etch anisotropy, sputter redeposition, and etch rate over an IBE system.

For many materials (e.g., silicon nitride, organic materials, or inorganic metal oxides) and/or certain desired slanted features (e.g., grating ridge with substantially equal leading edge and trailing edge), these known etching processes, such as the IBE process, RIBE process, and CAIBE process, may not be used to reliably fabricate the slanted structures. One reason is that these processes may not provide appropriate combinations of reactants and/or process parameters for etching the desired slanted structures on the desired materials. According to certain embodiments, a chemically assisted reactive ion beam etch (CARIBE) process can be used to fabricate slanted surface-relief structures on various materials. The CARIBE process disclosed herein may provide more effective control of radicals and ions by providing appropriate chemical components in the ion source and the gas ring, and thus may enable improved profile and mask selectivity for materials requiring a higher amount of chemical component for etching and may also help in increasing the etch stop margin. Using the CARIBE process, the features of the slanted structure can be more accurately fabricated on various materials, including materials that may need a higher amount of chemical components. In some embodiments, the process described herein may be used to fabricate a grating on an object that controls the behavior of light as the light reflects, refracts, and/or diffracts due to the interactions with the gratings and/or the interferences between light that interacts with the gratings. In some embodiments, the grating may be slanted and the object may be an optical element, such as a waveguide for waveguide display.

Figure 13:
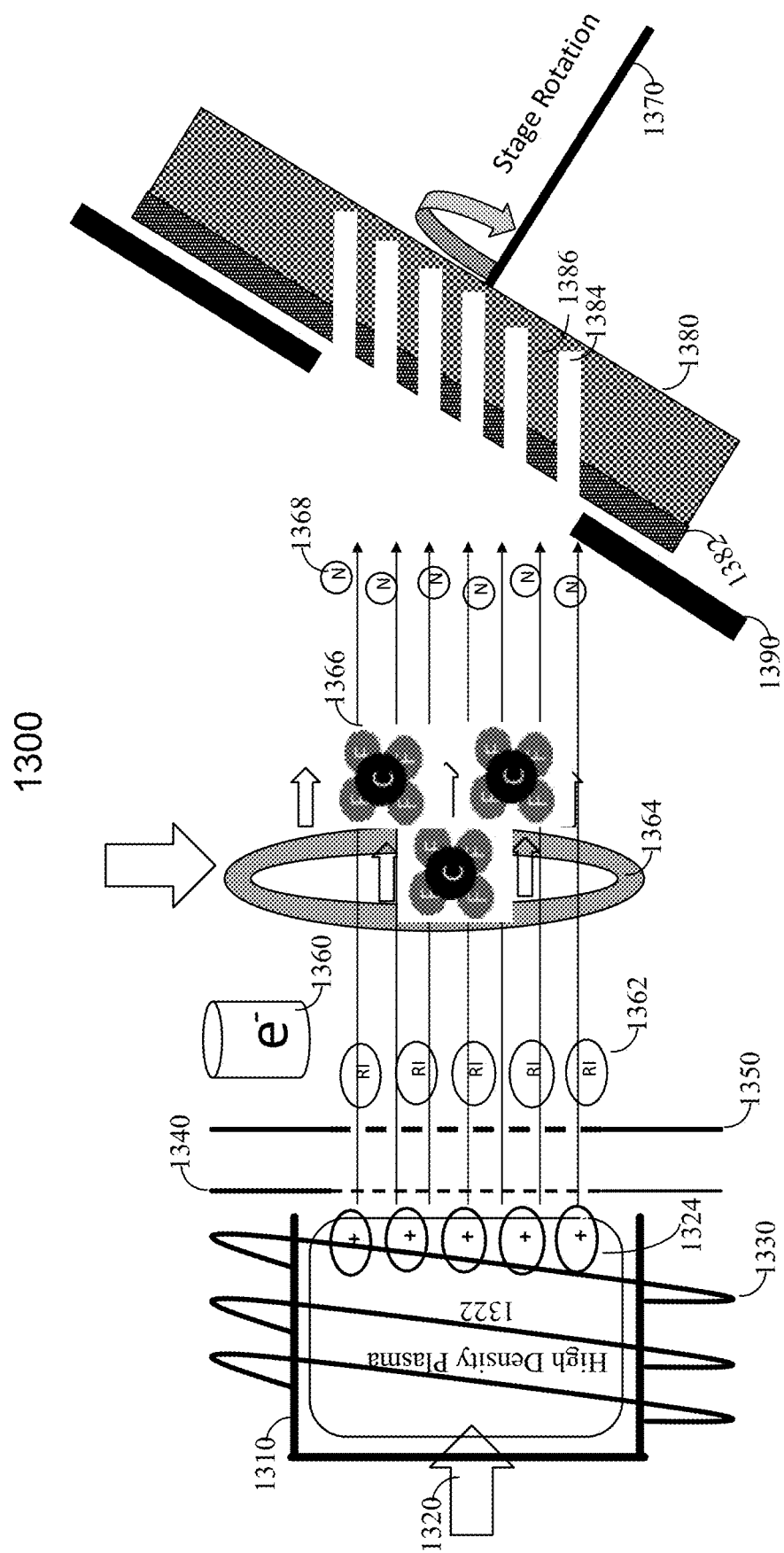
FIG. 13 illustrates an example chemically assisted reactive ion beam etching (CARIBE) system for fabricating a slanted surface-relief structure according to certain embodiments.

FIG. 13 illustrates an example chemically assisted reactive ion beam etching (CARIBE) system 1300 for fabricating a slanted surface-relief structure according to certain embodiments. CARIBE system 1300 may include a reactive ion source generator 1310. Reactive ion source generator 1310 may include an gas inlet 1320 for receiving a reactive gas (e.g., $CF_4$, $CHF_3$, $N_2$, $O_2$, $SF_6$, $H_2$, etc.) and, in some cases, an inert gas (e.g., Argon gas) into a chamber of reactive ion source generator 1310. A high density plasma 1322 may be generated by impact ionization in reactive ion source generator 1310 via an RF inductively coupled plasma (ICP) generator 1330. One or more aligned collimator grids may be used to extract a collimated reactive ion beam 1362 from high density plasma 1322. For example, as shown in FIG. 13, the aligned collimator grids may include a extraction grid 1340 that may contact high density plasma 1322 and control its potential, and an acceleration grid 1350 that may be driven by an adjustable negative high voltage supply for accelerating the extracted reactive ions. A beam neutralizer 1360 may be disposed near the aligned collimator grids and may emit an electron beam into collimated reactive ion beam 1362 to achieve a net neutral charge flux associated with collimated reactive ion beam 1362 in order to prevent the buildup of positive charges on the structure to be etched.

In addition, CARIBE system 1300 may include a gas ring 1364 for injecting an reactive gas 1366 (e.g., $CF_4$, $CHF_3$, $N_2$, $O_2$, $SF_6$, etc.) onto the material layer to be etched at a location close to the material layer. Collimated reactive ion beam 1362 (or neutrals 1368 after neutralization) and reactive gas 1366 may reach areas of a material layer 1380 uncovered by a mask 1382, and may physically and chemically etched the uncovered area due to physical milling and chemical reactions. For example, a $Si_3N_4$ layer may be chemically etched by a reactive gas $CF_4$ according to:

$$Si_3N_4 + 4CF_3 + F \rightarrow NF_3 + FCN_z + 3SiF_4,$$

where the $NF_3$, $FCN_2$, and $SiF_4$ may be volatile material and can be relatively easily removed to form the slanted structures in the $Si_3N_4$ layer. The neutral to ion ratio in the beam that reaches material layer 1380 in the CARIBE process may be higher than that in the RIBE or CAIBE process.

CARIBE system 1300 may include a shutter 1390 (or blade) for controlling the etch time and/or the etch region. Material layer 1380 may be mounted on a rotation stage 1370 that can be rotated to modify the angle of material layer 1380 with respect to the highly directional collimated reactive ion beam 1362. As a result, a slanted structure including a plurality of grooves 1384 and a plurality of ridges 1386 may be formed in material layer 1380. The width and the slant angle of ridges 1386 may be more precisely controlled, compare with the IBE, RIBE, or CAIBE process.

Figure 14B:
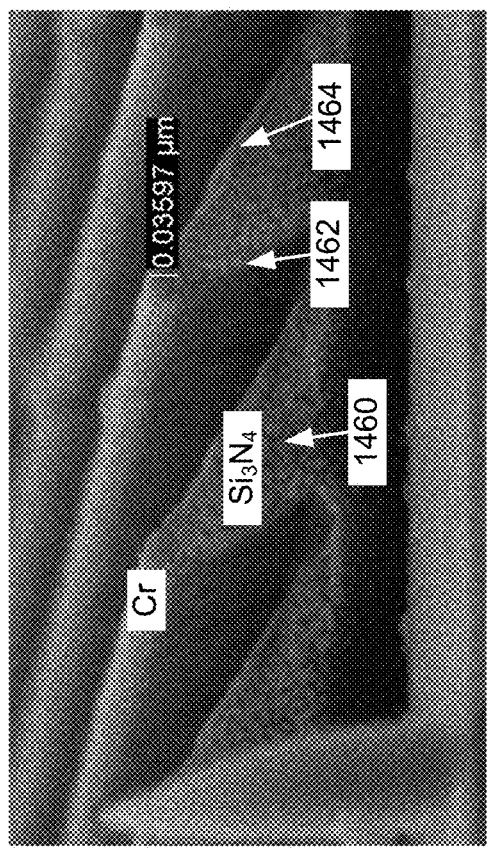
FIG. 14B illustrates an example slanted grating fabricated using the CAIBE process.
Figure 14A:
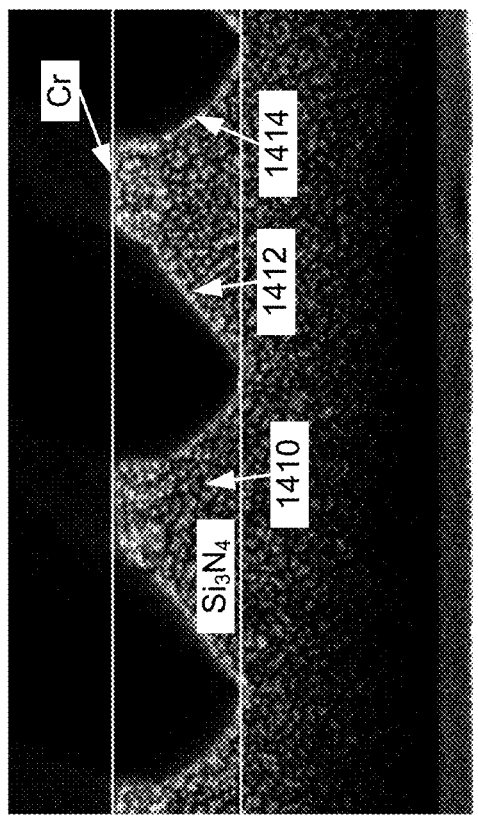
FIG. 14A illustrates an example slanted grating fabricated using the RIBE process.

FIG. 14A illustrates an example slanted grating 1400 fabricated using the RIBE process. Slanted grating 1400 may be fabricated on a $Si_3N_4$ layer using a chrome mask. As described above, in many applications according to certain embodiments, it is often desirable that the leading edge and the trailing edge of the ridge of the slanted grating are substantially parallel to each other to achieve certain desired performance. As shown in FIG. 14A, the slant angle of a leading edge 1412 of a ridge 1410 of slanted grating 1400 may be very different from the slant angle of a trailing edge 1414 of ridge 1410 of slanted grating 1400. This may be caused by the accumulation of certain materials (e.g., carbon) generated during the etching process. Thus, slanted grating 1400 fabricated using the RIBE process may not have the desired features of the slanted gratings for certain applications.

FIG. 14B illustrates an example slanted grating 1450 fabricated using the CAIBE process. Similarly to slanted grating 1400, slanted grating 1450 may be fabricated on a $Si_3N_4$ layer using a chrome mask. As shown in FIG. 14B, the slant angle of a leading edge 1462 of a ridge 1460 of slanted grating 1450 may be very different from the slant angle of a trailing edge 1464 of ridge 1460 of slanted grating 1450. This may be caused by the accumulation of certain materials (e.g., carbon) generated during the etching process. Thus, slanted grating 1450 fabricated using the CAIBE process may not have the desired features of the slanted gratings for certain applications either.

Figure 15A:
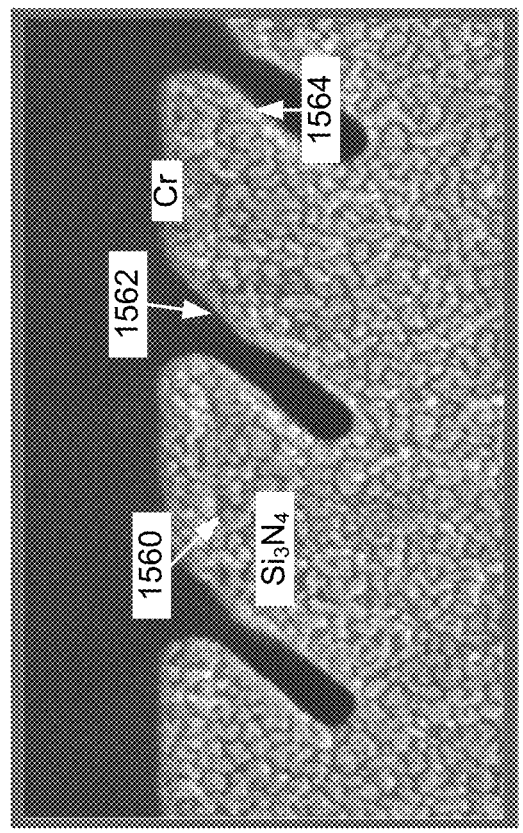
FIG. 15A illustrates an example slanted grating fabricated using the CARIBE process according to certain embodiments.

FIG. 15A illustrates an example slanted grating 1500 fabricated using the CARIBE process according to certain embodiments. Slanted grating 1500 may be fabricated on a $Si_3N_4$ layer using a chrome mask. As shown in FIG. 15A, the slant angle of a leading edge 1512 of a ridge 1510 of slanted grating 1500 may be similar to the slant angle of a trailing edge 1514 of ridge 1510 of slanted grating 1500. More specifically, in the example shown in FIG. 15A, the slant angle of leading edge 1512 may be measured to be about 44°, the slant angle of trailing edge 1514 may be about 43°, the duty cycle of slanted grating 1500 may be about 50%, and the depth of ridge 1510 may be about 200 nm.

Figure 15B:
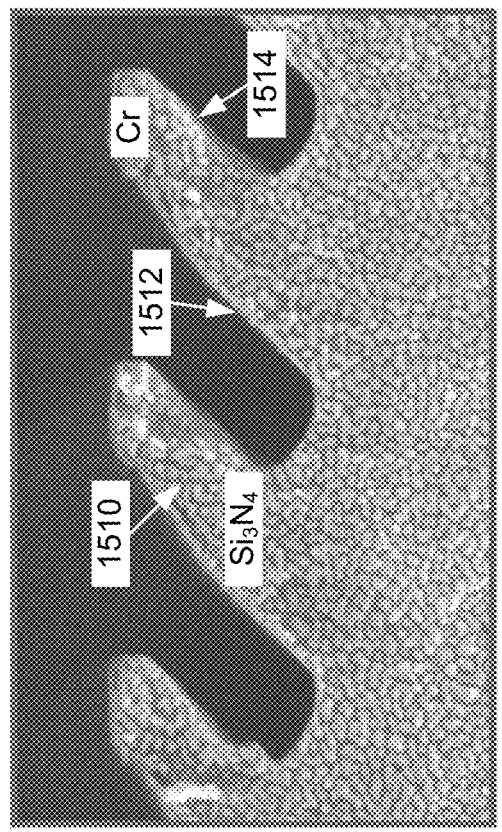
FIG. 15B illustrates an example slanted grating fabricated using the CARIBE process according to certain embodiments.

FIG. 15B illustrates another example slanted grating 1550 fabricated using the CARIBE process according to certain embodiments. Slanted grating 1550 may also be fabricated on a $Si_3N_4$ layer using a chrome mask. As shown in FIG. 15B, the slant angle of a leading edge 1562 of a ridge 1560 of slanted grating 1550 may be similar to the slant angle of a trailing edge 1564 of ridge 1560 of slanted grating 1550. In the example shown in FIG. 15B, the depth of ridge 1510 may be about 200 nm, and the duty cycle of slanted grating 1550 may be greater than 80%. In other words, a narrow and deep slanted groove with the leading edge parallel to the trailing edge may be fabricated using the CARIBE process disclosed herein.

FIGS. 15A and 15B show that the CARIBE process disclosed herein can achieve symmetric profiles and target depths for materials such as $Si_3N_4$. The CARIBE process can be used to reliably fabricated a slanted structure with a leading edge and a trailing edge parallel or substantially parallel to each other (e.g., with a slant angle difference less than about 1, 2, 3, 5, or 10 degrees). In some embodiments, the symmetric profile may lead to an improved performance (e.g., as compared to gratings formed using the IBE, RIBE, or CAIBE process) of an output coupler of a waveguide display used in an augmented-reality system. Furthermore, the CARIBE process can be used to fabricate deep and accurate surface relief structures while maintaining the parallel relationship between the leading edge and the trailing edge.

Figure 16:
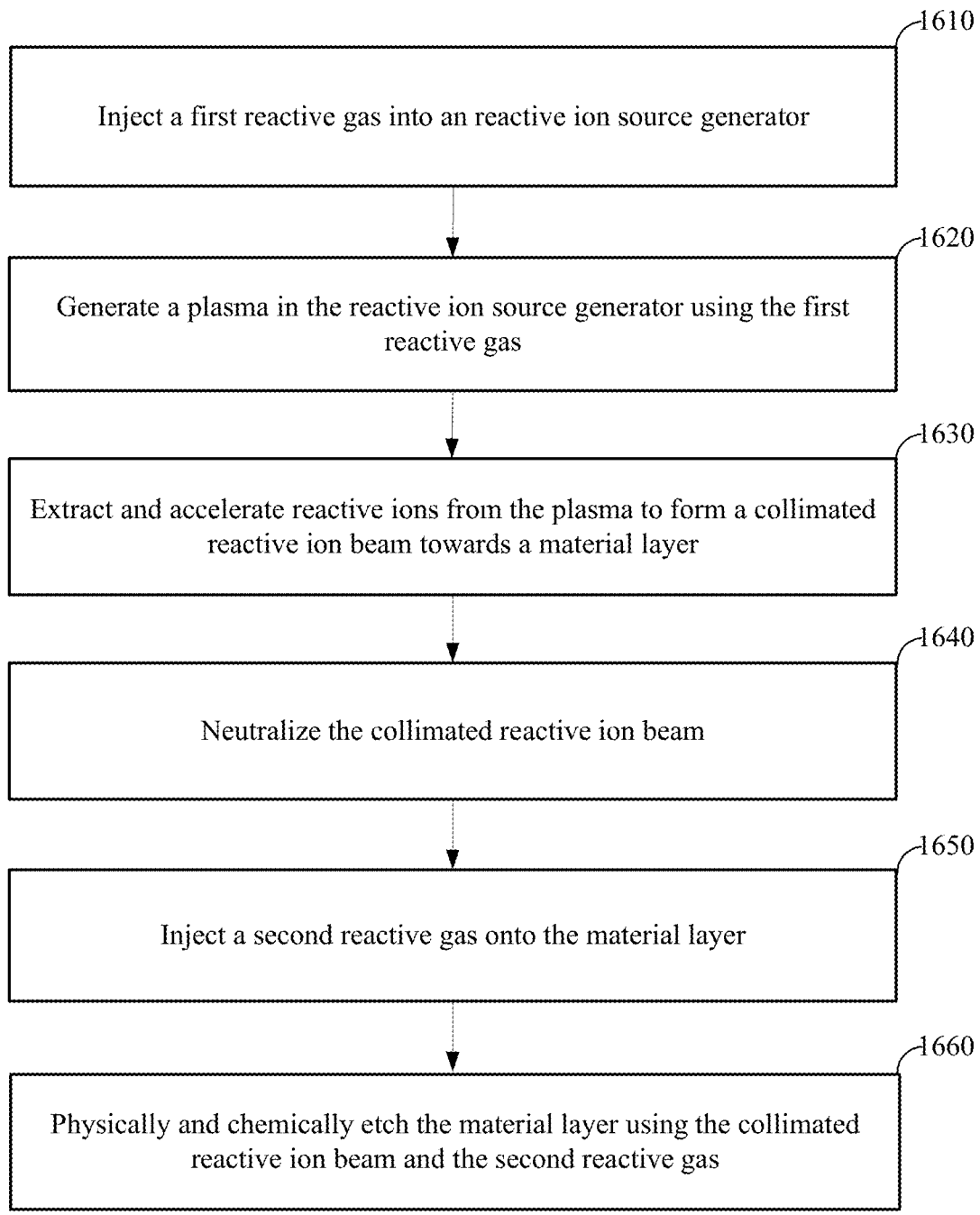
FIG. 16 is a simplified flow chart illustrating an example method of fabricating a slanted surface-relief structure according to certain embodiments.

FIG. 16 is a simplified flow chart 1600 illustrating an example method of fabricating a slanted surface-relief structure according to certain embodiments. The operations described in flow chart 1600 are for illustration purposes only and are not intended to be limiting. In various implementations, modifications may be made to flow chart 1600 to add additional operations or to omit some operations. The operations described in flow chart 1600 may be performed using, for example, CARIBE system 1300 described above.

At block 1610, a first reactive gas may be injected into a chamber of an reactive ion source generator, such as reactive ion source generator 1310 shown in FIG. 13. The first reactive gas may include, for example, $CF_4$, $CHF_3$, $N_2$, $O_2$, $SF_6$, $H_2$, $Cl_2$, $BCl_3$, HBr, etc. In some embodiments, an inert gas, such as Argon, He, or Ne, may also be injected into the reactive ion source generator.

At block 1620, the reactive ion source generator may generate a high density plasma in the chamber of the reactive ion source generator. For example, a time-varying electric current (e.g., an RF current signal) may be passed through a coil that may create a time-varying magnetic field around it, which may in turn induce an electric field in the chamber of the reactive ion source generator and lead to the discharge of electrons. The discharged electrons may impact the gas in the chamber of the reactive ion source generator to generate reactive ions (e.g., $CF_3^+$ and $Ar^+$). Thus, the chamber of the reactive ion source generator may include neutrals, ions, and electrons.

At block 1630, the reactive ions may be extracted from the high density plasma and may be accelerated to form a collimated reactive ion beam towards a material layer to be etched. For example, as described above, one or more aligned collimator grids may be used to extract and accelerate the reactive ions to form a highly directive, highly energetic collimated reactive ion beam. In some embodiments, the one or more aligned collimator grids may include an extraction grid that may contact the high density plasma and control its potential, and an acceleration grid that may be driven by an adjustable negative high voltage supply for accelerating the ions.

Optionally, at block 1640, the collimated reactive ion beam extracted from the reactive ion source generator by the aligned collimator grids may be neutralized by an electron beam to form a collimated beam that may include neutrals and/or ions and electrons that are approximately in charge equilibrium. Therefore, the collimated beam may be electronically neutral, thus preventing the buildup of positive charges on the material layer to be etched.

At block 1650, a second reactive gas may be injected onto the material layer to be etched using a gas ring as described above. The second reactive gas may include, for example, $CF_4$, $CHF_3$, $N_2$, $O_2$, $SF_6$, $Cl_2$, $BCl_3$, HBr, etc. The second reactive gas may be injected at a location closed to the material layer to be etched.

At block 1660, the collimated beam and the second reactive gas may both physically mill and chemically etch the material layer as described above. As also described above, the material layer to be etched, such as a silicon wafer, a glass substrate, a titanium oxide layer, an alumina layer, or a $Si_3N_4$ material layer, may be mounted on a rotation stage that may rotate with respect to the direction of the collimated beam based on the desired slant angle of the slanted structure to be etched on the material layer. The material layer may be partially covered by a patterned mask including a pattern similar to the desired pattern of a cross-section of the slanted structure. In some embodiments, a shutter or blade may be used to control the etch time and/or etch region on the material layer.

In some embodiments, the slanted grating fabricated using the method described in flow chart 1600 may be over-coated with a material having a refractive index different from the grating material layer. For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and/or fill the gaps between the ridges of the slanted grating. In some embodiments, a low refractive index material, such as silicon oxide, alumina, porous silica, or fluorinated low index monomer (or polymer), may be used to over-coat the slanted grating and/or fill the gaps between the ridges of the slanted grating. As a result, the difference between the refractive index of the ridges and the refractive index of the grooves of the slanted grating may be greater than 0.1, 0.2, 0.3, 0.5, 1.0, or higher.

Embodiments of the invention may include or be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 17:
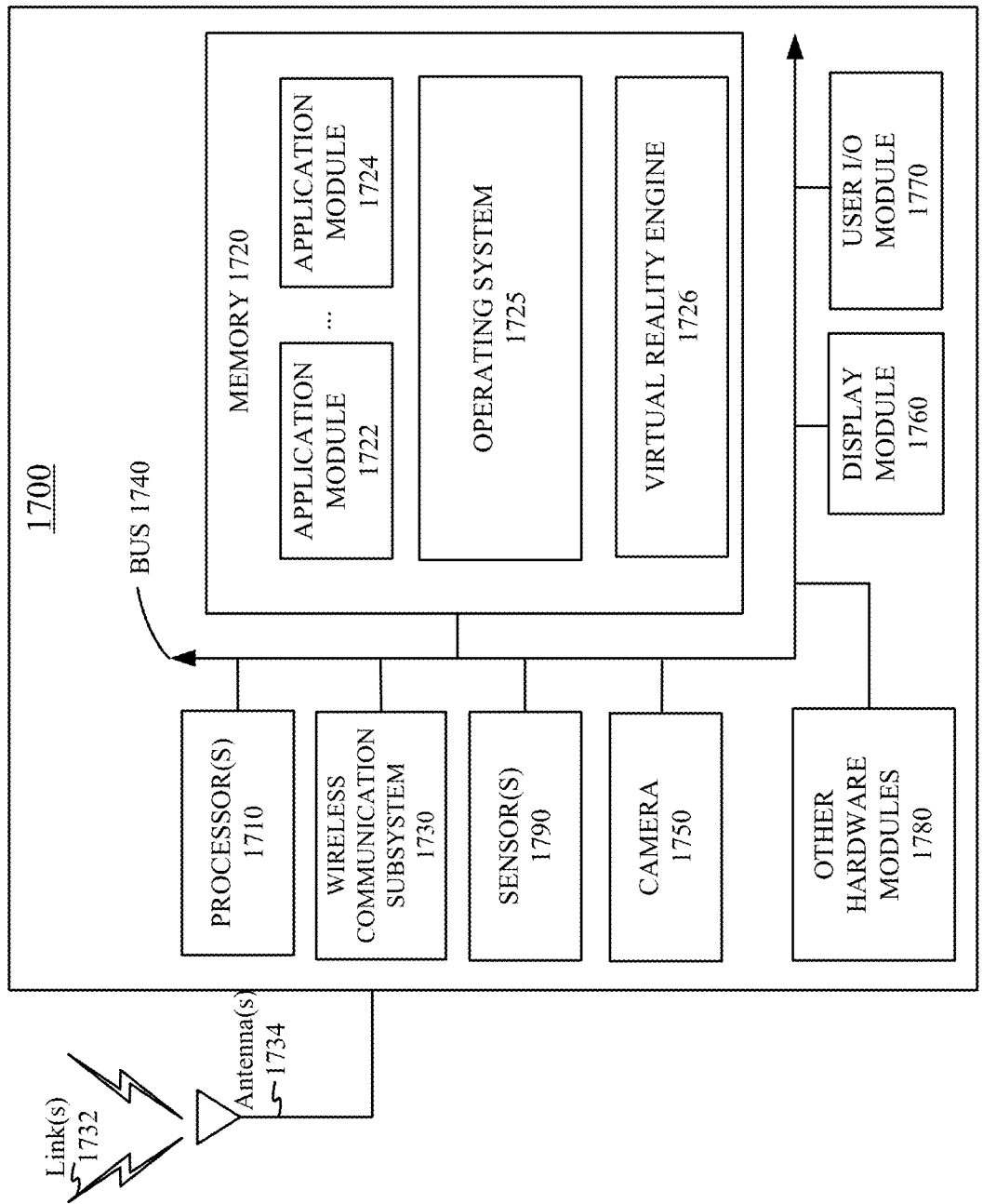
FIG. 17 is a simplified block diagram of an example electronic system of an example near-eye display for implementing some of the examples disclosed herein.

FIG. 17 is a simplified block diagram of an example electronic system 1700 of an example near-eye display (e.g., HMD device) for implementing some of the examples disclosed herein. Electronic system 1700 may be used as the electronic system of an HMD device or other near-eye displays described above. In this example, electronic system 1700 may include one or more processor(s) 1710 and a memory 1720. Processor(s) 1710 may be configured to execute instructions for performing operations at a number of components, and can be, for example, a general-purpose processor or microprocessor suitable for implementation within a portable electronic device. Processor(s) 1710 may be communicatively coupled with a plurality of components within electronic system 1700. To realize this communicative coupling, processor(s) 1710 may communicate with the other illustrated components across a bus 1740. Bus 1740 may be any subsystem adapted to transfer data within electronic system 1700. Bus 1740 may include a plurality of computer buses and additional circuitry to transfer data.

Memory 1720 may be coupled to processor(s) 1710. In some embodiments, memory 1720 may offer both short-term and long-term storage and may be divided into several units. Memory 1720 may be volatile, such as static random access memory (SRAM) and/or dynamic random access memory (DRAM) and/or non-volatile, such as read-only memory (ROM), flash memory, and the like. Furthermore, memory 1720 may include removable storage devices, such as secure digital (SD) cards. Memory 1720 may provide storage of computer-readable instructions, data structures, program modules, and other data for electronic system 1700. In some embodiments, memory 1720 may be distributed into different hardware modules. A set of instructions and/or code might be stored on memory 1720. The instructions might take the form of executable code that may be executable by electronic system 1700, and/or might take the form of source and/or installable code, which, upon compilation and/or installation on electronic system 1700 (e.g., using any of a variety of generally available compilers, installation programs, compression/decompression utilities, etc.), may take the form of executable code.

In some embodiments, memory 1720 may store a plurality of application modules 1722 through 1724, which may include any number of applications. Examples of applications may include gaming applications, conferencing applications, video playback applications, or other suitable applications. The applications may include a depth sensing function or eye tracking function. Application modules 1722-1724 may include particular instructions to be executed by processor(s) 1710. In some embodiments, certain applications or parts of application modules 1722-1724 may be executable by other hardware modules 1780. In certain embodiments, memory 1720 may additionally include secure memory, which may include additional security controls to prevent copying or other unauthorized access to secure information.

In some embodiments, memory 1720 may include an operating system 1725 loaded therein. Operating system 1725 may be operable to initiate the execution of the instructions provided by application modules 1722-1724 and/or manage other hardware modules 1780 as well as interfaces with a wireless communication subsystem 1730 which may include one or more wireless transceivers. Operating system 1725 may be adapted to perform other operations across the components of electronic system 1700 including threading, resource management, data storage control and other similar functionality.

Wireless communication subsystem 1730 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1700 may include one or more antennas 1734 for wireless communication as part of wireless communication subsystem 1730 or as a separate component coupled to any portion of the system. Depending on desired functionality, wireless communication subsystem 1730 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1730 may permit data to be exchanged with a network, other computer systems, and/or any other devices described herein. Wireless communication subsystem 1730 may include a means for transmitting or receiving data, such as identifiers of HMD devices, position data, a geographic map, a heat map, photos, or videos, using antenna(s) 1734 and wireless link(s) 1732. Wireless communication subsystem 1730, processor(s) 1710, and memory 1720 may together comprise at least a part of one or more of a means for performing some functions disclosed herein.

Embodiments of electronic system 1700 may also include one or more sensors 1790. Sensor(s) 1790 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1790 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1700 may include a display module 1760. Display module 1760 may be a near-eye display, and may graphically present information, such as images, videos, and various instructions, from electronic system 1700 to a user. Such information may be derived from one or more application modules 1722-1724, virtual reality engine 1726, one or more other hardware modules 1780, a combination thereof, or any other suitable means for resolving graphical content for the user (e.g., by operating system 1725). Display module 1760 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1700 may include a user input/output module 1770. User input/output module 1770 may allow a user to send action requests to electronic system 1700. An action request may be a request to perform a particular action. For example, an action request may be to start or end an application or to perform a particular action within the application. User input/output module 1770 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1700. In some embodiments, user input/output module 1770 may provide haptic feedback to the user in accordance with instructions received from electronic system 1700. For example, the haptic feedback may be provided when an action request is received or has been performed.

Electronic system 1700 may include a camera 1750 that may be used to take photos or videos of a user, for example, for tracking the user's eye position. Camera 1750 may also be used to take photos or videos of the environment, for example, for VR, AR, or MR applications. Camera 1750 may include, for example, a complementary metal-oxide-semiconductor (CMOS) image sensor with a few millions or tens of millions of pixels. In some implementations, camera 1750 may include two or more cameras that may be used to capture 3-D images.

In some embodiments, electronic system 1700 may include a plurality of other hardware modules 1780. Each of other hardware modules 1780 may be a physical module within electronic system 1700. While each of other hardware modules 1780 may be permanently configured as a structure, some of other hardware modules 1780 may be temporarily configured to perform specific functions or temporarily activated. Examples of other hardware modules 1780 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1780 may be implemented in software.

In some embodiments, memory 1720 of electronic system 1700 may also store a virtual reality engine 1726. Virtual reality engine 1726 may execute applications within electronic system 1700 and receive position information, acceleration information, velocity information, predicted future positions, or some combination thereof of the HMD device from the various sensors. In some embodiments, the information received by virtual reality engine 1726 may be used for producing a signal (e.g., display instructions) to display module 1760. For example, if the received information indicates that the user has looked to the left, virtual reality engine 1726 may generate content for the HMD device that mirrors the user's movement in a virtual environment. Additionally, virtual reality engine 1726 may perform an action within an application in response to an action request received from user input/output module 1770 and provide feedback to the user. The provided feedback may be visual, audible, or haptic feedback. In some implementations, processor(s) 1710 may include one or more GPUs that may execute virtual reality engine 1726.

In various implementations, the above-described hardware and modules may be implemented on a single device or on multiple devices that can communicate with one another using wired or wireless connections. For example, in some implementations, some components or modules, such as GPUs, virtual reality engine 1726, and applications (e.g., tracking application), may be implemented on a console separate from the head-mounted display device. In some implementations, one console may be connected to or support more than one HMD.

In alternative configurations, different and/or additional components may be included in electronic system 1700. Similarly, functionality of one or more of the components can be distributed among the components in a manner different from the manner described above. For example, in some embodiments, electronic system 1700 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method of fabricating a slanted surface-relief structure in a material layer, the method comprising:
   injecting a first reactive gas into an reactive ion source generator;
   generating a plasma using the first reactive gas in the reactive ion source generator, the plasma including reactive ions of the first reactive gas that are configured to react with the material layer to generate volatile materials;
   extracting at least some of the reactive ions from the plasma to form a collimated reactive ion beam towards the material layer; and
   injecting a second reactive gas onto the material layer, the second reactive gas configured to react with the material layer,
   wherein the collimated reactive ion beam and the second reactive gas etch the material layer both physically and chemically to form the slanted surface-relief structure in the material layer.

2. The method of claim 1, further comprising:
   rotating the material layer based on a desired slant angle of the slanted surface-relief structure.

3. The method of claim 1, wherein the first reactive gas comprises at least one of $CF_4$, $CHF_3$, $N_2$, $O_2$, $SF_6$, $Cl_2$, $BCl_3$, HBr, $H_2$, Ar, He, or Ne.

4. The method of claim 1, wherein the material layer includes a semiconductor substrate, a $SiO_2$ layer, a $Si_3N_4$ material layer, a titanium oxide layer, an alumina layer, a SiC layer, a $SiO_xN_y$ layer, an amorphous silicon layer, a spin on carbon (SOC) layer, an amorphous carbon layer (ACL), a diamond like carbon (DLC) layer, a $TiO_x$ layer, an $AlO_x$ layer, a $TaO_x$ layer, or a $HFO_x$ layer.

5. The method of claim 1, wherein generating the plasma in the reactive ion source generator comprises:
   applying an RF signal to an inductively coupled plasma generator of the reactive ion source generator.

6. The method of claim 1, wherein extracting at least some of the reactive ions from the plasma to form the collimated reactive ion beam comprises:
   applying an extraction voltage on an extraction grid adjacent to the reactive ion source generator; and
   applying an acceleration voltage on an acceleration grid to extract and accelerate at least some of the reactive ions, wherein the extraction grid and the acceleration grid are aligned; and
   wherein the acceleration voltage is lower than the extraction voltage.

7. The method of claim 1, wherein injecting the second reactive gas comprises:
   injecting the second reactive gas onto the material layer using a gas ring.

8. The method of claim 1, wherein the second reactive gas comprises at least one of $CF_4$, $CHF_3$, $N_2$, $O_2$, $SF_6$, $Cl_2$, $BCl_3$, or HBr.

9. The method of claim 1, further comprising:
   neutralizing the collimated reactive ion beam before etching the material layer using the collimated reactive ion beam and the second reactive gas.

10. The method of claim 9, wherein neutralizing the collimated reactive ion beam comprises:
    injecting an electron beam into the collimated reactive ion beam.

11. The method of claim 1, wherein:
    the slanted surface-relief structure comprises a slanted surface-relief optical grating.

12. The method of claim 11, wherein:
    the slanted surface-relief optical grating comprises a plurality of ridges; and
    a leading edge of each ridge is parallel to a trailing edge of the ridge.

13. The method of claim 12, wherein:
    a slant angle of the leading edge and a slant angle of the trailing edge are greater than 30 degrees with respect to a surface normal of the material layer.

14. The method of claim 11, wherein:
    a depth of the slanted surface-relief optical grating is greater than 100 nm.

15. The method of claim 11, wherein:
    a duty cycle of the slanted surface-relief optical grating is greater than 60%.

* * * * *